(12) United States Patent
Yoshida et al.

(10) Patent No.: US 6,236,078 B1
(45) Date of Patent: *May 22, 2001

(54) SEMICONDUCTOR MEMORY DEVICE

(75) Inventors: Masahiro Yoshida; Hideyuki Ando, both of Tokyo (JP)

(73) Assignee: Oki Electric Industry Co., Ltd., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/933,954

(22) Filed: Sep. 19, 1997

(30) Foreign Application Priority Data

Sep. 24, 1995 (JP) .................................. 8/252095

(51) Int. Cl.⁷ .................. H01L 27/108; H01L 29/76; H01L 29/94; H01L 31/119
(52) U.S. Cl. .................. 257/306; 257/296; 257/309
(58) Field of Search .................. 257/296–313; 438/396–400, 243–256

(56) References Cited

U.S. PATENT DOCUMENTS

| | | | |
|---|---|---|---|
| 5,053,351 | 10/1991 | Fazan et al. . | |
| 5,068,199 | * 11/1991 | Sandhu | 257/303 |
| 5,071,781 | * 12/1991 | Seo et al. | 438/397 |
| 5,196,365 | * 3/1993 | Gotou | 438/254 |
| 5,227,651 | * 7/1993 | Kim et al. | 257/309 |
| 5,236,859 | * 8/1993 | Bae et al. | 438/397 |
| 5,268,322 | * 12/1993 | Lee et al. | 438/396 |
| 5,340,763 | * 8/1994 | Dennison | 438/396 |
| 5,354,705 | 10/1994 | Mathews et al. . | |
| 5,449,635 | * 9/1995 | Jun | 438/397 |

FOREIGN PATENT DOCUMENTS

| | | |
|---|---|---|
| 44 08 565 A1 | 7/1995 | (DE) . |
| 195 23 743 A1 | 1/1996 | (DE) . |
| 2 244 862 | 12/1991 | (GB) . |
| 1-147857 | 6/1989 | (JP) . |
| 404226069A * | 8/1992 | (JP) .................. 257/306 |

OTHER PUBLICATIONS

Patent Abstracts of Japan vol. 17, No. 401 (E–1404), Jul. 27, 1993 & JP 05 075056 A (Miyagi Oki Denki KK), Mar. 26, 1993, *abstract*.

Patent Abstracts of Japan vol. 16, No. 558 (E–1294), Nov. 27, 1992 & JP 04 214666 A (Sharp Corp), Aug. 5, 1992, *abstract*.

* cited by examiner

Primary Examiner—Minh Loan Tran
Assistant Examiner—Cuong Q Nguyen
(74) Attorney, Agent, or Firm—Jones Volentine, L.L.P.

(57) ABSTRACT

In a semiconductor device, a transfer transistor having a drain region and a source region is formed on an Si semiconductor substrate. A lower end of a storage node is electrically connected to the drain region through a drain contact hole defined in an interlayer insulator. The storage node has an on-film extending portion which extends on an upper electrode portion which protrudes from the on-film extending portion. Structurally, the fin-shaped electrode portion is provided within a capacitor region so as to extend within a region smaller than the capacitor region and is spaced away from the on-film extending portion on the side of a bit line contact hole defined in the interlayer insulator.

14 Claims, 40 Drawing Sheets

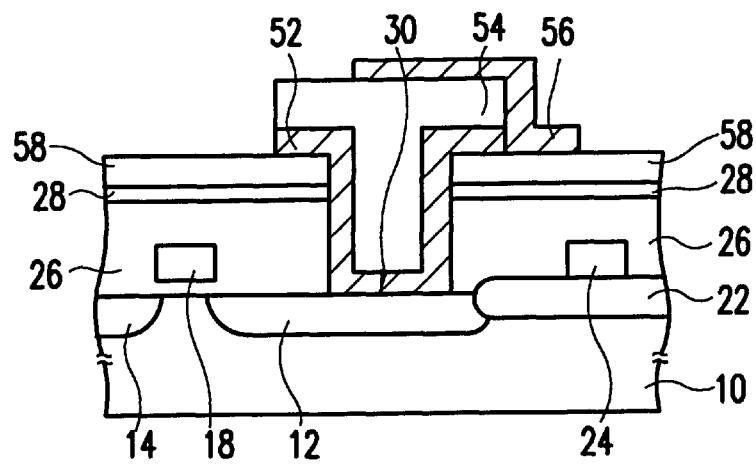
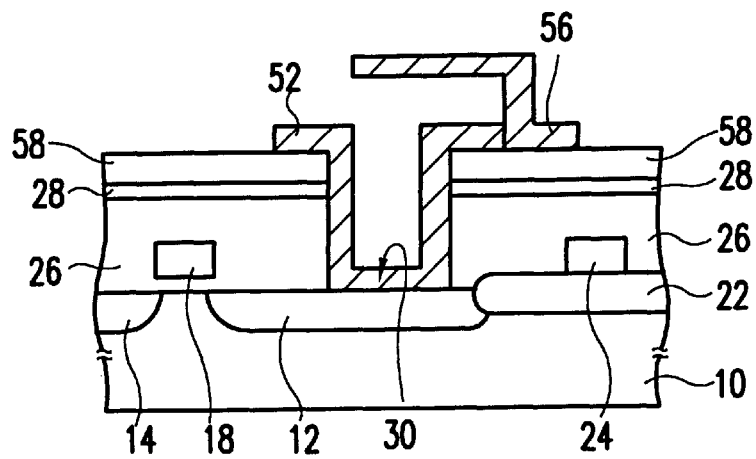
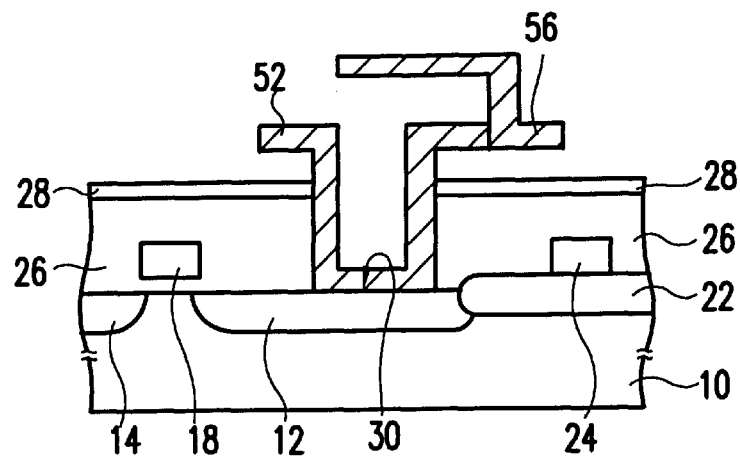

SEMICONDUCTOR MEMORY DEVICE

BACKGROUND OF THE INVENTION

1. Field of the Invention

This invention relates to a structure of a capacitor for storing data therein, which is suitable for use in a semiconductor memory device, and a method of manufacturing it.

2. Description of the Related Art

In a semiconductor memory device (e.g., a DRAM (Dynamic Random Access Memory)), a stack-type capacitor has been used heavily as a capacitor for storing a signal charge therein. This type of stack-type capacitor is a capacitor having a structure wherein a dielectric film is formed between conductive layers stacked as electrodes. Further, there is also known one in which each electrode takes the shape of a fin to enlarge the area of the capacitor.

SUMMARY OF THE INVENTION

It is an object of the present invention to provide a structure capable of preventing resistance to a soft error incident to a decrease in the area of a stack-type capacitor having a conventional structure by miniaturization of a device from being degraded in the stack-type capacitor, and storing the amount of electric charges required to store or retain data.

It is another object of the present invention to provide a structure having a stack-type capacitor whose electrode is fin-shaped, which is capable of restricting an increase in the aspect ratio of a contact hole forming a bit line therein, which occurs as the thickness of a memory cell increases.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 21 is a view showing a further manufacturing process employed in the third embodiment, which follows the manufacturing process shown in FIG. 20;

DETAILED DESCRIPTION OF THE PREFERRED EMBODIMENTS

Preferred embodiments of the present invention will hereinafter be described in detail with reference to the accompanying drawings.

[First Embodiment]

Figure 1:
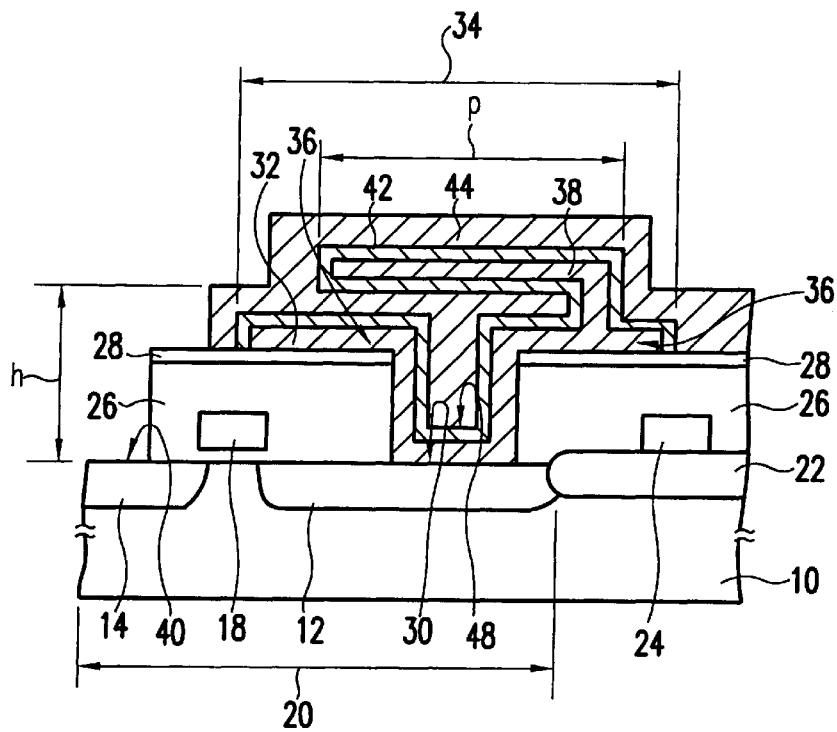
FIG. 1 is a view showing a configuration of a DRAM cell according to a first embodiment of the present invention.

FIG. 1 is a view showing a configuration of a DRAM cell according to a first embodiment of the present invention. The drawing is a cross-sectional view of a cut area of the DRAM cell, which is cut away and shown at a position including a region in which a transfer transistor and a capacitor are formed. Incidentally, each of a storage node 32, a capacitor nitride film 42 and a cell plate 44, which constitute the capacitor, are marked with hatching in the drawings shown below. Others are not hatched in the drawings.

Figure 2:
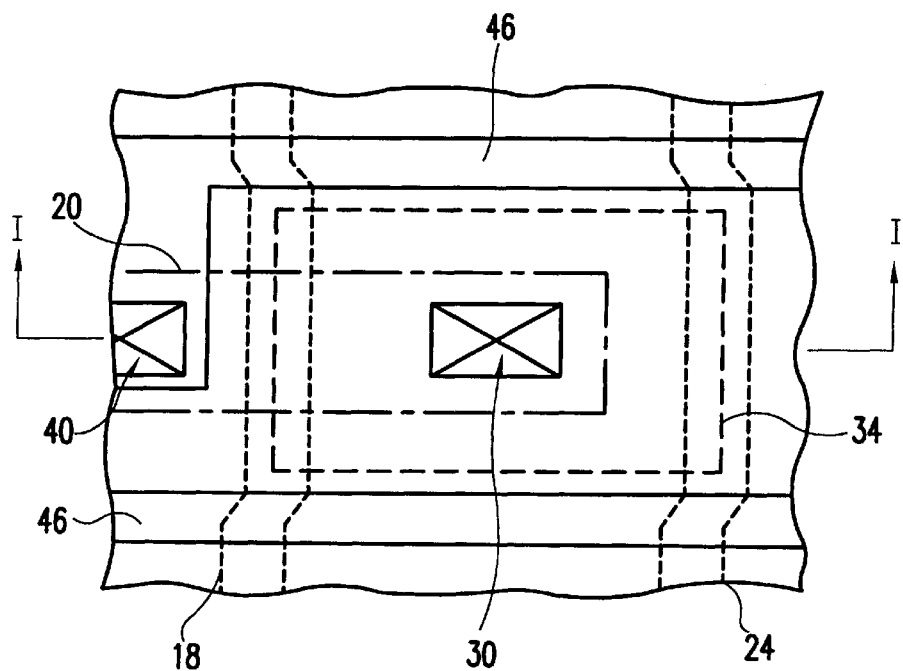
FIG. 2 is a view illustrating a planar configuration of the DRAM cell shown in FIG. 1.

FIG. 2 is a plan view showing the configuration of the DRAM cell according to each embodiment. A first word line 18, a transfer transistor 20, a capacitor region 34, a hole 30 for making contact with the drain of the transfer transistor 20, a contact hole 40 for a bit line, and the bit line 46 are principally shown in FIG. 2. Further, a bit line 46 and a second word line 24 used for controlling another memory cell are also illustrated in FIG. 2. FIG. 1 is equivalent to a sectional view of a cut area cut away and shown at a position taken along line I—I of FIG. 2. However, the bit lines 46 are omitted from FIG. 1 to avoid complexity of illustration. Further, an insulating layer provided to provide electrical isolation between the bit lines is omitted from FIG. 1, whereas a cell plate used as an upper electrode of the capacitor and an insulating layer provided to provide electrical isolation between bit lines are omitted from FIG. 2.

The first configuration example shown in FIG. 1 is a semiconductor memory device wherein a storage node constituting a capacitor is electrically connected to a first conductive layer via a first aperture or opening defined in an insulating film. In the present embodiment, the first conductive layer corresponds to a drain region (drain electrode) 12 formed by implanting impurities in an Si semiconductor substrate 10. Similarly, a source region (source electrode) 14 used as a second conductive layer is formed by injecting the impurities into the Si semiconductor substrate 10. Their conduction types are formed with, for example, the Si semiconductor substrate 10 as a p layer and the drain and source regions 12 and 14 as n$^+$ layers.

Further, a first word line (gate electrode) 18 is provided within a region on the Si semiconductor substrate 10 between the drain region 12 and the source region 14 through an insulating film. Control for continuity between the drain region 12 and the source region 14 is performed by a signal supplied to the first word line 18. Thus, the transfer transistor 20 having the drain region 12, source region 14 and first word line 18 is formed in the Si semiconductor substrate 10. Incidentally, a second word line 24 for controlling another memory cell is also provided at an upper portion of each of field oxide films 22 in FIG. 1. The individual transfer transistors 20 are electrically separated from one another by the field oxide films 22. Each memory cell region is defined by the field oxide films 22 so that one transfer transistor is contained in one memory cell region.

Each of interlayer insulators 26 is layered on its corresponding transfer transistor 20. The transfer transistor 20 is covered with the interlayer insulator 26. Further, a stopper nitride film 28 required upon formation is stacked on the upper surface of each interlayer insulator 26. A drain contact hole 30 used as a first aperture or opening is defined in the interlayer insulator 26 and stopper nitride film 28. The storage node 32, which serves as a lower electrode of the capacitor, is embedded in the drain contract hole 30. Thus, a lower portion of the storage node 32 is electrically connected to the aforementioned drain region 12.

The storage node 32 has a structure having an on-film extending portion 36, which extends within the capacitor region 34 on the sides above the interlayer insulators 26 (and the stopper nitride films 28), and a fin-shaped electrode portion 38 which protrudes from the on-film extending portion 36. As described above, the storage node 32 is formed in a state of being connected to the drain contact hole 30. In the present embodiment, the storage node 32 is formed so as to take a shape continuous over the drain region 12 bared or exposed from the drain contract hole 30 and an inner wall surface of the drain contact hole 30, i.e., an exposed surface of each interlayer insulator 26. Thus, a portion (hereinafter called "cup-shaped portion") of the storage node 32, which has been embedded in the drain contact hole 30, is configured so that the bottom of the cup-shaped portion having a U-shaped cross-section is connected to its corresponding drain region 12.

Further, the storage node 32 is formed so as to continuously extend from the inner wall surface of the drain contact hole 30 to an upper region of each interlayer insulator 26. A portion of the storage node 32 extending in the upper region (capacitor region 34) of the interlayer insulator 26 corresponds to the on-film extending portion 36. Thus, the storage node 32 has the on-film extending portion 36 connected to an edge of the cup-shaped portion embedded in the drain contact hole 30.

The fin-shaped electrode portion 38 is a portion of the storage node 32, which protrudes from the upper surface of the on-film extending portion 36. The fin-shaped electrode portion 38 employed in the present embodiment is provided so as to occupy a region (corresponding to a region indicated by symbol p in FIG. 1) smaller than the capacitor region 34.

Further, the DRAM cell according to the first embodiment is a semiconductor memory device wherein the bit line is connected to the source region 14 via the bit line contact hole 40 defined as a second aperture or opening for the interlayer insulator 26. At this time, the fin-shaped electrode portion 38 employed in the present embodiment has a structure in which it is provided away from the on-film extending portion 36 on the bit line contact hole 40 side. Accordingly, no fin-shaped electrode portion 38 is connected to the on-film extending portion 36 of the storage node 32 on the side opposite to the bit line contact hole 40. Thus, no fin-shaped electrode portion 38 is electrically connected to the upper surface of the on-film extending portion 36 adjacent to the bit line contact hole 40. An inner wall surface of the cup-shaped portion of the storage node 32 is exposed from a portion thereof from which the fin-shaped electrode portion 38 and the on-film extending portion 36 are spaced.

Described specifically, the fin-shaped electrode portion 38 employed in the embodiment projects from the on-film extending portion 36 provided on the side opposite to the on-film extending portion 36 formed on the bit line contact hole 40 side and is shaped in the form of a roof or hood extending away from the on-film extending portion 36 with respect to the direction of the bit line contact hole 40 side.

Figure 3:
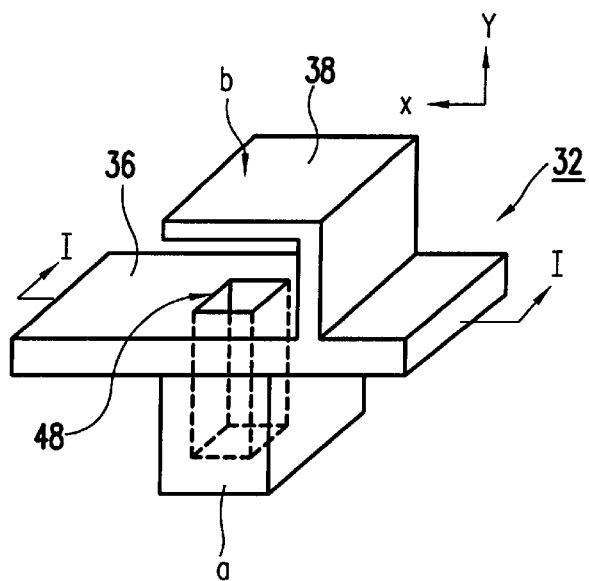
FIG. 3 is a view depicting a capacitor structure employed in the first embodiment.

FIG. 3 is a perspective view showing the configuration or shape of the storage node 32 to describe a capacitor structure employed in the first embodiment. A cross section of a cut area cut away and shown at a position taken along line I—I in FIG. 3 corresponds to a cross section of the storage node 32, which has been indicated by taking out the storage node 32 shown in FIG. 1.

The storage node 32 employed in the present embodiment has the cup-shaped portion (corresponding to a portion designated at symbol a in FIG. 3), the on-film extending portion 36 connected to the edge of the cup-shaped portion, and the fin-shaped electrode portion 38 that projects from the on-film extending portion 36. The fin-shaped electrode portion 38 has one end connected to the on-film extending portion 36, extends in an upward direction (corresponding to a Y direction in FIG. 3) as viewed from its connected portion, and is bent in an L-shaped frame in the direction (corresponding to an X direction in FIG. 3) substantially parallel to the vertical direction, i.e., the upper surface of the substrate after it has extended to some degree of height. Further, the fin-shaped electrode portion 38 is shaped in the form of the hood extending in the horizontal direction from the L-shaped frame in a state of being spaced away from the on-film extending portion 36. A recess or concave portion 48 formed by inner wall surfaces of the cup-shaped portion a whose bottom is connected to the drain region 12, is located on the side below the hood portion (corresponding to a portion designated at symbol b in FIG. 3) extending in the horizontal direction X. Further, the bit line contact hole 40 is provided in the extending direction of the hood portion b. A leading end of the hood portion b is not connected to the on-film extending portion 36.

Figure 4:
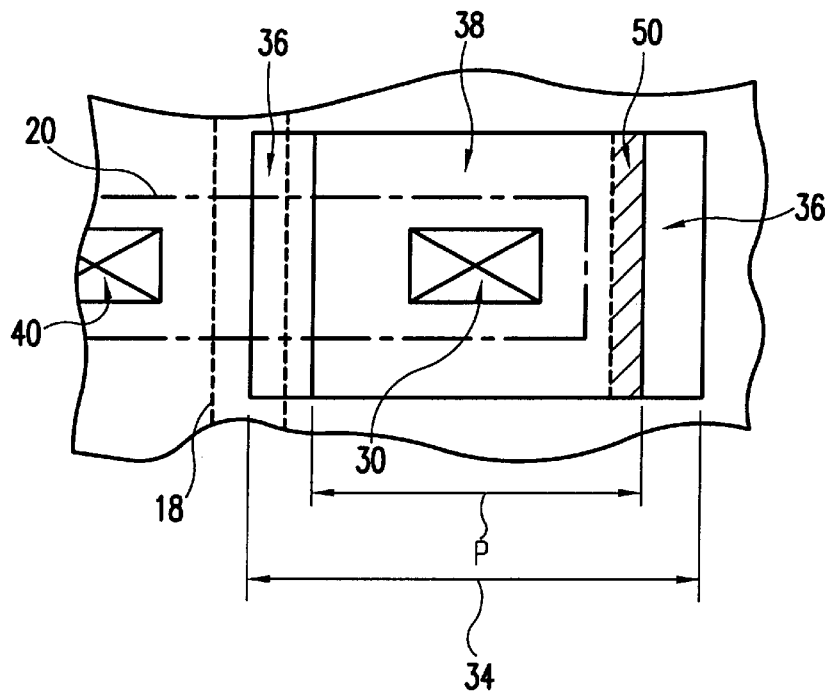
FIG. 4 is a view showing a planar configuration of the capacitor structure shown in FIG. 3.

FIG. 4 is a view principally showing the relationship of layout between the capacitor region 34 and each transfer transistor 20 employed in the first embodiment and a planar configuration of the storage node 32 to describe the capacitor structure employed in the first embodiment.

Outer edges of the on-film extending portion 36 constituting the storage node 32 first define the capacitor region 34. A portion 50 (corresponding to a diagonally-shaded portion in FIG. 4) where the on-film extending portion 36 and the fin-shaped electrode portion 38 are connected to each other, is located relative to the drain contact hole 30, on the upper surface of the on-film extending portion 36 on the side opposite to the on-film extending portion 36 on the bit line contact hole 40 side. One end of the fin-shaped electrode portion 38 whose cross-section cut at the position taken along line I—I in FIG. 3 is L-shaped, is connected to the connecting portion 50. The other end of the fin-shaped electrode portion 38 horizontally extends toward the bit line contact hole 40 over the contact hole 30 and the on-film extending portion 36. A region (corresponding to a region designated at symbol p in FIG. 4) occupied by the fin-shaped electrode portion 38, is formed as a region provided within the capacitor region 34 and smaller than the capacitor region 34.

The fin-shaped electrode portion 38 employed in the present embodiment is shaped in the form of the hood that covers the upper side of the drain contact hole 30. As can be understood from the cross-sectional view of FIG. 1 and the plan view of FIG. 4, the drain region 12 of each transfer transistor 20 is located within a region including the drain contact hole 30. Further, the source region 14 of the transfer transistor 20 is located within a region including the bit line contact hole 40. As described above, the first word line 18 is provided on the substrate 10 lying between the drain region 12 and the source region 14. In FIG. 4, a portion of the first word line 18 is illustrated so as to be included within the capacitor region 34.

The capacitor nitride film 42 used as a capacitor dielectric film is formed on the surface of the storage node 32 having the above-described configuration, which is exposed from each interlayer insulator 26. In the construction of the first embodiment, the capacitor nitride film 42 is formed on the inner wall surfaces of the cup-shaped portion a (or concave portion 48), the upper surface and sides of the on-film extending portion 36 and the surface of the fin-shaped electrode portion 38. Further, a conductive material is stacked on the surface of the capacitor nitride film 42 and used as the cell plate 44 serving as the upper electrode of the capacitor (see FIGS. 1 and 3).

Thus, the capacitor is composed of the storage node 32, the capacitor nitride film 42 and the cell plate 44. Next, an insulating layer for providing electrical separation from each bit line is provided on the upper side of the cell plate 44. The bit line is formed on the upper surface of the insulating layer. The bit line contact hole 40 extending from the upper surface of the insulating layer to the upper surface of the substrate 10 is defined on the insulating layer and each bit line is embedded in the bit line contact hole 40 so as to be electrically connected to the source region 14.

In the capacitor structure employed in the first embodiment as described above, the area of the capacitor is increased by the surface area of the fin-shaped electrode portion 38. With its increase, the electric capacity (called "capacitance Cs") of the capacitor also becomes great.

Further, the capacitor employed in the first embodiment takes the structure wherein the fin-shaped electrode portion 38 is formed within the capacitor region 34 so as to occupy the region smaller than the capacitor region 34. Therefore, the region in which no fin-shaped electrode portion 38 extends, exists within the capacitor region 34.

In the capacitor region 34 in which the fin-shaped electrode portion 38 does not extend, the thickness (corresponding to the height from the surface of the substrate 10 to the upper surface of the cell plate 44 or the height from the surface of the substrate 10 to the upper surface of the insulating layer stacked on the cell plate 44 to provide each bit line) of each memory cell on the bit line contact hole 40 side is reduced by the thickness of the fin-shaped electrode portion 38. Namely, the thickness of the memory cell on the bit line contact hole side can be reduced by adjusting the region in which the fin-shaped electrode portion 38 extends. Thus, the depth of the bit line contact hole 40 can be formed shallowly and an aspect (depth-to-diameter) ratio of the contact hole 40 can be reduced.

In order to reduce the aspect ratio of the bit line contact hole 40, it is desirable to achieve separation between the fin-shaped electrode portion 38 and the on-film extending portion 36 on the bit line contact hole 40 side and form the fin-shaped electrode portion extending region within the capacitor region 34 so as to be smaller than the capacitor region 34 in size as in the case of the capacitor structure shown in FIGS. 1 and 3. This configuration allows a reduction in the thickness of the memory cell (DRAM cell) on the bit line contact hole 40 side.

As a result, the structure is obtained which is easy to form each bit line 46.

According to the capacitor structure employed in the first embodiment as described above, the electric capacity Cs of the capacitor increases and the aspect ratio of the bit line contact hole 40 is reduced.

A method of forming the capacitor structure employed in the first embodiment will next be described with reference to FIGS. 14 through 16. FIGS. 14, 15 and 16 are respectively cross-sectional views showing forming processes of the capacitor structure employed in the first embodiment.

Figure 14A:
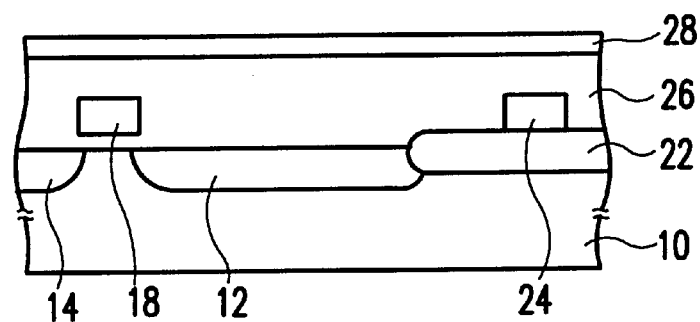
FIG. 14 is a view illustrating a manufacturing process employed in the first embodiment of the present invention.

As shown in FIG. 14(A), an interlayer insulator 26 and a stopper nitride film 28 are first successively stacked on an Si semiconductor substrate 10 with a drain region 12 and a source region 14 formed therein.

As a material used for the interlayer insulator 26 employed in the present embodiment, a non-doped silicon oxide film is used and formed so as to range from 2000 Å to 5000 Å in thickness by a CVD (Chemical-Vapor Deposition) process. Further, silicon nitride is used as a material for the stopper nitride film 28 and is formed so as to range from 100 Å to 300 Å in thickness by the CVD process. The stopper nitride film 28 serves as an etching stopper and is provided to prevent the interlayer insulator 26 from being etched upon an etching process to be carried out later. Incidentally, a field oxide film 22 for defining a memory cell region is formed in the silicon semiconductor substrate 10 in advance so as to range from 4000 Å to 6000 Å in thickness by a LOCOS process (Local Oxidation process).

Figure 14B:
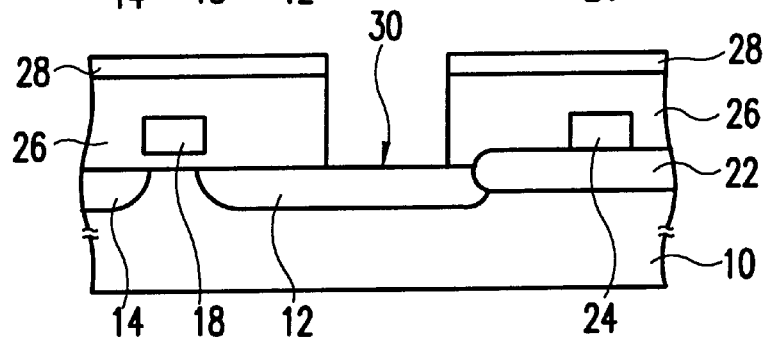

Next, a drain contact hole 30 is defined in the interlayer insulator 26 and the stopper nitride film 28 located above the drain region 12 as shown in FIG. 14(B).

The drain contact hole 30 is defined by normal photolithography and etching. The drain contact hole 30 corresponds to a hole that reaches up to the upper surface of the substrate 10 from the upper surface of the stopper nitride film 28. In the present embodiment, the diameter of the drain contact hole 30 is about 0.5 $\mu$m.

Figure 14C:
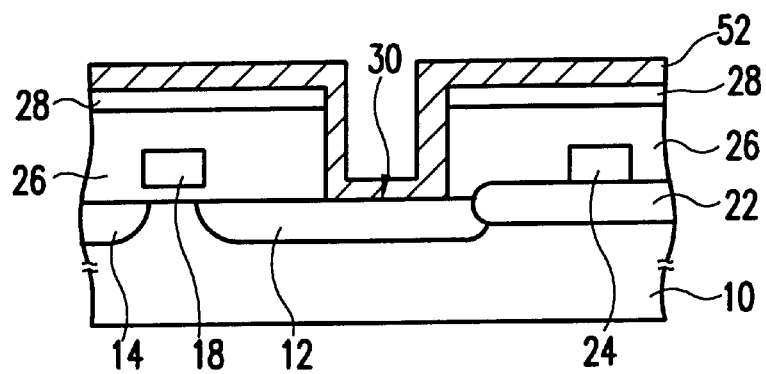

Next, a first storage node film is formed over the upper surface of the stopper nitride film 28 and the drain region 12 bared or exposed from the drain contact hole 30 as illustrated in FIG. 14(C).

A first polysilicon layer 52 is used as the first storage node film. The first polysilicon layer 52 uses polysilicon as its material and is formed so as to range from 1000 Å to 2000 Å in thickness by the CVD process. In order to improve conductivity of the first polysilicon layer 52, $As^+$ is implanted into the first polysilicon layer 52 so as to range from $4.0E15$ $cm^{-2}$ to $6.0E15$ $cm^{-2}$ in dose at acceleration energies ranging from 30 KeV to 60 KeV. Further, annealing is done at temperatures ranging from 800° C. to 1000° C. for 20 to 40 minutes in an atmosphere of $N_2$ to diffuse the implanted $As^+$.

Figure 14D:
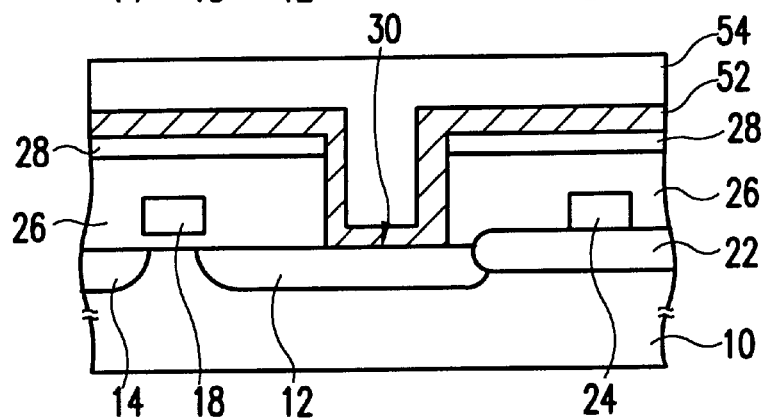

Next, a first sacrifice film is formed on the upper surface of the first polysilicon layer 52 as shown in FIG. 14(D).

A first PSG film 54 is used as the first sacrifice film. The first PSG film 54 utilizes PSG (Phospo-Silicate-Glass) as its material and is formed so as to range from 1000 Å to 2000 Å in thickness by the CVD process. The drain contact hole 30 is padded or filled with the first PSG film 54.

Figure 15A:
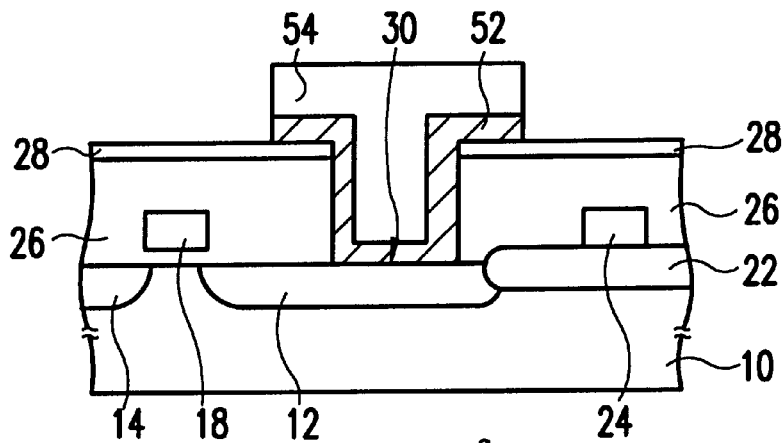
FIG. 15 is a view showing another manufacturing process employed in the first embodiment, which follows the manufacturing process shown in FIG. 14.

Next, the first PSG film 54 and the first polysilicon layer 52 are patterned as shown in FIG. 15(A).

This patterning is performed by using a normal photolithography and etching technique. A resist layer is first formed on the upper surface of the first PSG film 54 and a mask is formed on a region including the drain contact hole 30 by photolithography. Next, the mask is used to etch the first PSG film 54 by an oxide film etching device. Thereafter, the mask is used to etch the first polysilicon layer 52 by a polysilicon etching device.

Figure 15B:
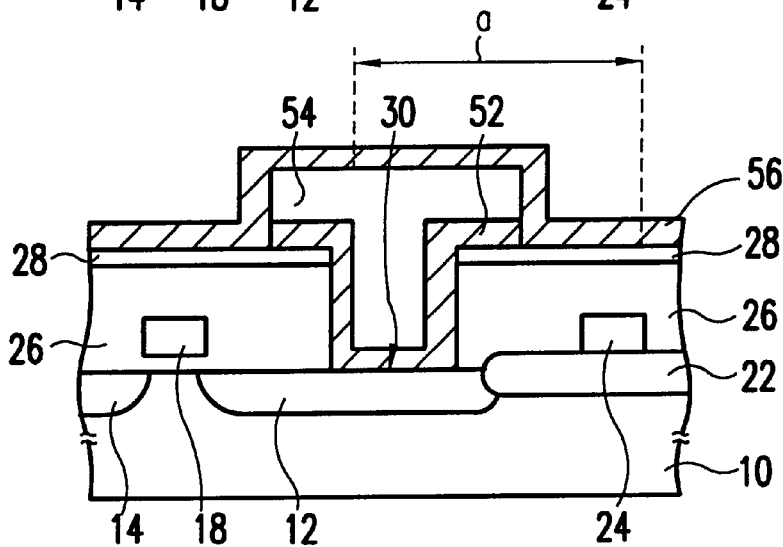

Next, the patterned first PSG film 54 and first polysilicon layer 52 are covered with a second storage node film as shown in FIG. 15(B).

A second polysilicon layer 56 is used as the second storage node film. The second polysilicon layer 56 uses polysilicon as its material and is formed so as to range from 1000 Å to 2000 Å in thickness by the CVD process. In order to improve conductivity of the second polysilicon layer 56, phosphorus is diffused into the second polysilicon layer 56 so as to range from $4.0E20$ $cm^{-3}$ to $6.0E20$ $cm^{-3}$ in phosphorus concentration. Further, phosphorus glass for covering the surface of the second polysilicon layer 56 is removed by wet etching using a solution of hydrofluoric acid.

Figure 15C:
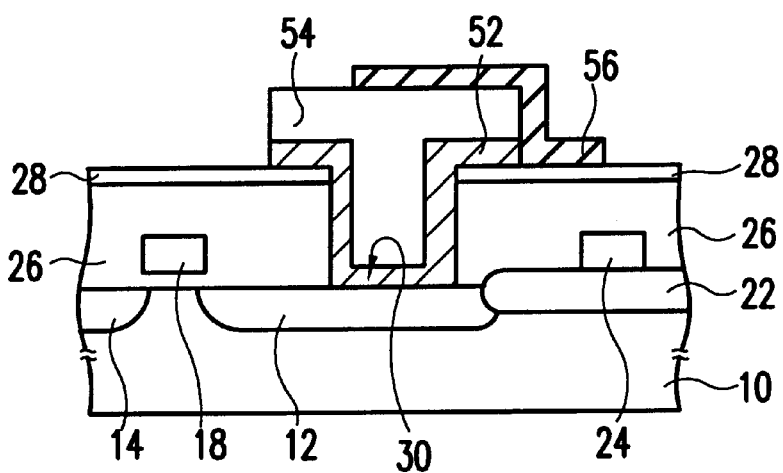

Next, the second polysilicon layer 56 is subjected to patterning to expose the first PSG film 54 as shown in FIG. 15(C).

This patterning is carried out using the normal photolithography and etching technique. This patterning process step corresponds to a process of removing the second polysilicon layer 56 to expose the first PSG film 54 on the formation or definition side of the bit line contact hole 40. Namely, the second polysilicon layer 56 is removed such that a portion (corresponding to a region indicated by symbol a in FIG. 15(B)) thereof remains which adjoins one side face of the first polysilicon layer 52 on the side opposite to the definition side of the bit line contact hole 40 and extends on the upper side of the first polysilicon layer 52.

Figure 16A:
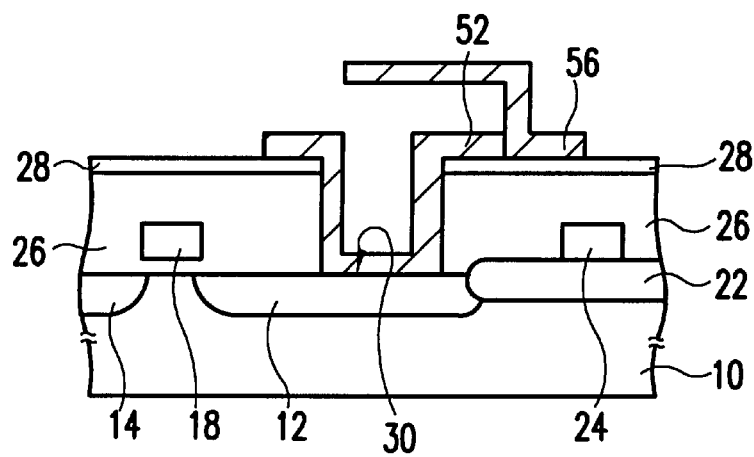
FIG. 16 is a view illustrating a further manufacturing process employed in the first embodiment, which follows the manufacturing process shown in FIG. 15.

The first PSG film 54 is removed as shown in FIG. 16(A).

In the present process step, the portion of the first PSG film 54, which has been exposed in the previous patterning process step, is etched so that the first PSG film 54 is all removed. HF etching or isotropic dry etching may preferably be used as this etching. A storage node 32 composed of the first polysilicon layer 52 and the second polysilicon layer 56 is formed according to the process steps referred to above.

Figure 16B:
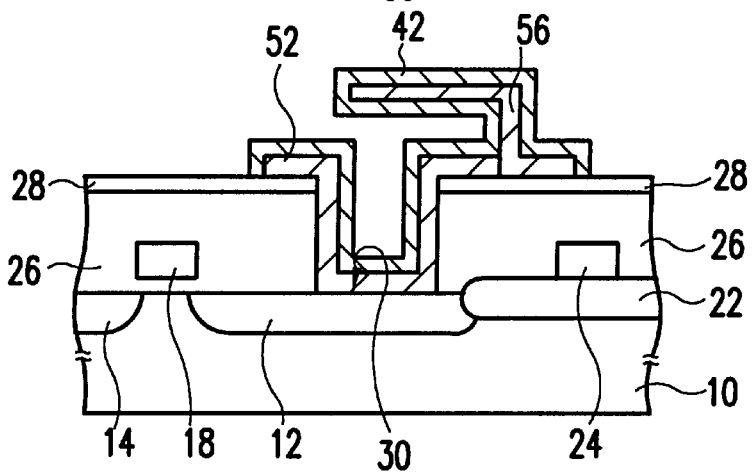

Next, a dielectric film is formed on the surfaces of the first and second polysilicon layers 52 and 56 as shown in FIG. 16(B).

In the present embodiment, a capacitor nitride film 42 is used as the dielectric film. The capacitor nitride film 42 uses silicon nitride as its material and is formed so as to range from 60 Å to 80 Å in thickness by the CVD process. According to the present process step, the capacitor nitride film 42 is formed on exposed surfaces of the first and second polysilicon layers 52 and 56.

Figure 16C:
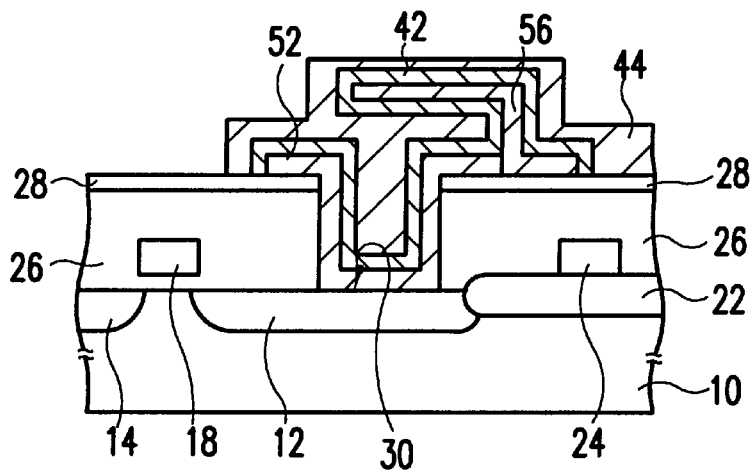

Next, a cell plate film is formed on the capacitor nitride film 42 as shown in FIG. 16(C).

In the present embodiment, polysilicon is used as the cell plate film and is layered so as to range from 1000 Å to 2000 Å in thickness by the CVD process. Since the diameter of the drain contact hole 30 and the thickness of the first polysilicon layer 52 used as the first storage node film are formed so as to take 0.5 μm and 0.1 μm respectively in the present embodiment as mentioned above, the cell plate film is embedded inside the contact hole (corresponding to the concave portion 48 in FIG. 3). Subsequently, the cell plate film is subjected to patterning by using the normal photolithography and etching technique to form a cell plate 44.

Thereafter, an insulating layer, a bit line contact hole 40, metal interconnections (bit lines) and a protective film are formed. As a result, a semiconductor memory device leads to completion.

The capacitor structure (see FIG. 1) employed in the first embodiment can be formed according to the above-described manufacturing processes. According to the manufacturing processes, the second polysilicon layer 56 used as the second storage node film is patterned so that the first sacrifice film on the definition side of the bit line contact hole 40 is exposed. Therefore, the etchant is easy to enter round and the first PSG film 54 used as the first sacrifice film is easy to execute its etching in the process step for removing all of the first sacrifice film.

[Second Embodiment]

Figure 5:
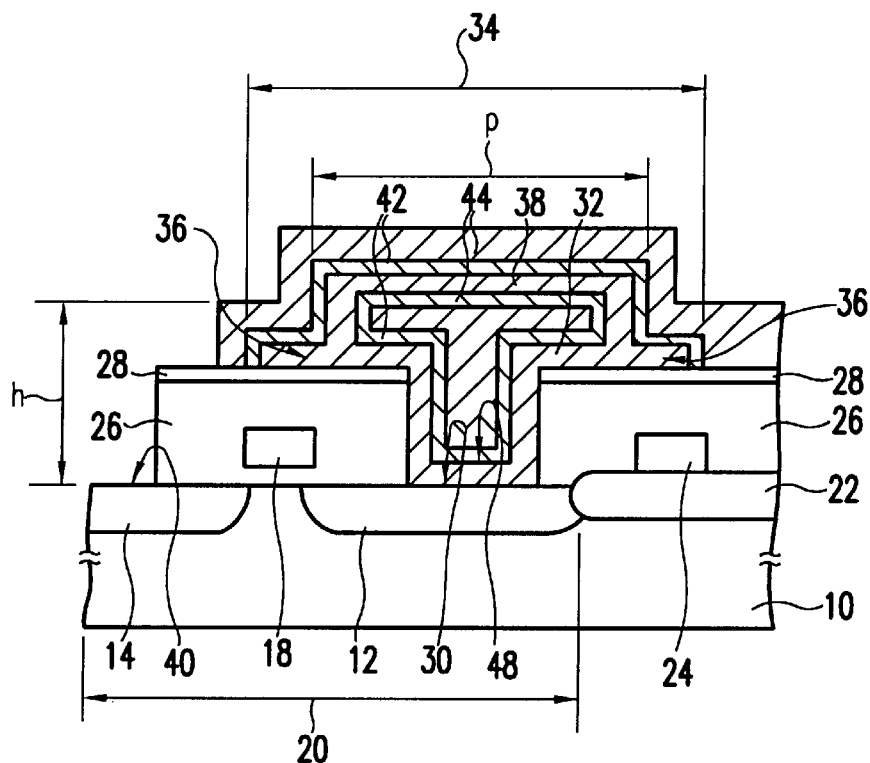
FIG. 5 is a view illustrating a configuration of a DRAM cell according to a second embodiment of the present invention.

FIG. 5 is a view showing a configuration of a DRAM cell according to a second embodiment of the present invention. The present drawing is a cross-sectional view of a cut area of the DRAM cell, which is cut away and shown at a position including a region in which bit lines, a transfer transistor and a capacitor are formed. Incidentally, the description of the same elements of structure as those employed in the first embodiment might be omitted.

A fin-shaped electrode portion 38 of a storage node 32 employed in the second embodiment is first provided so as to project from an on-film extending portion 36 and occupy a region (corresponding to a region designated at symbol p in FIG. 5) placed within a capacitor region 34 and smaller than the capacitor region 34 in a manner similar to the first embodiment.

The DRAM cell according to the second embodiment is a semiconductor memory device wherein a bit line is electrically connected to a source region 14 through a bit line contact hole 40 defined as a second aperture or opening for an interlayer insulator 26. At this time, the fin-shaped electrode portion 38 employed in the present embodiment is shaped in the form of a roof which protrudes from an on-film extending portion 36 on the side opposite to the on-film extending portion 36 on the bit line contact hole 40 side and is connected to the on-film extending portion 36 on the bit line contact hole 40 side. Thus, the fin-shaped electrode portion 38 employed in the second embodiment differs from the fin-shaped electrode portion 38 employed in the first embodiment and is also connected to the on-film extending portion 36 of the storage node 32 on the bit line contact hole 40 side.

Figure 6:
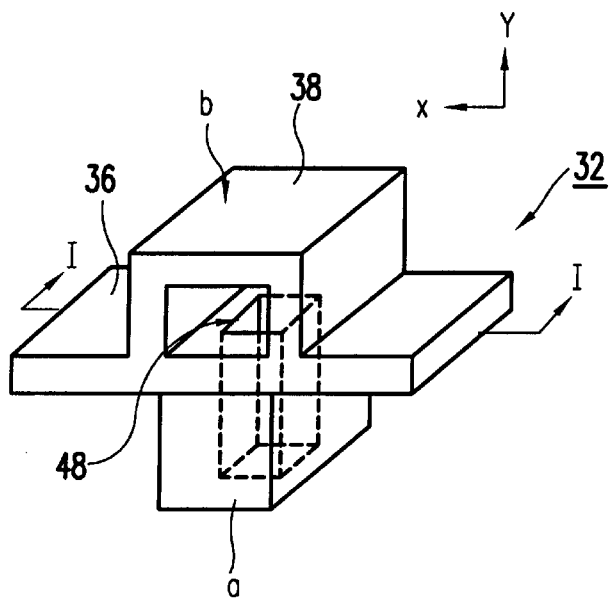
FIG. 6 is a view depicting a capacitor structure employed in the second embodiment.

FIG. 6 is a perspective view showing the configuration of the storage node 32 to describe a capacitor structure employed in the second embodiment. A cross section of a cut area cut away and shown at a position taken along line I—I in FIG. 6 corresponds to a cross section of the storage node 32 shown in FIG. 5.

The storage node 32 employed in the present embodiment has a cup-shaped portion (corresponding to a portion designated at symbol a in FIG. 6), the on-film extending portion 36 connected to the edge of the cup-shaped portion, and the fin-shaped electrode portion 38 that projects from the on-film extending portion 36. The fin-shaped electrode portion 38 has one end connected to the on-film extending portion 36. The fin-shaped electrode portion 38 extends in an upward direction (corresponding to a Y direction in FIG. 6) as viewed from its connected portion and is bent in the vertical direction, i.e., the direction (corresponding to an X direction in FIG. 6) parallel to the upper surface of the substrate after it has extended to some degree of height. Further, the fin-shaped electrode portion 38 extends in the horizontal direction (corresponding to the X direction in FIG. 6) in a state of being spaced away from the on-film extending portion 36 and is bent downward along the vertical direction again so that the other end thereof is connected to the on-film extending portion 36. Thus, the fin-shaped electrode portion 38 employed in the present embodiment is shaped in the form of the roof (cover) connected to the on-film extending portion 36 at two points.

A drain contact hole 30 is covered with this covering portion (corresponding to a portion designated at symbol b in FIG. 6). Namely, a recess or concave portion 48 formed by inner wall surfaces of a cup-shaped portion a whose bottom is connected to a drain region 12, is defined so as to be located on the side below the roof portion b extending in the horizontal direction X over the drain contact hole 30 and the on-film extending portion 36. Thus, a cross section (corresponding to a cross section at a position taken along line I—I) of the fin-shaped electrode portion 38 is represented in the form of an inverse U-shaped frame.

Figure 7:
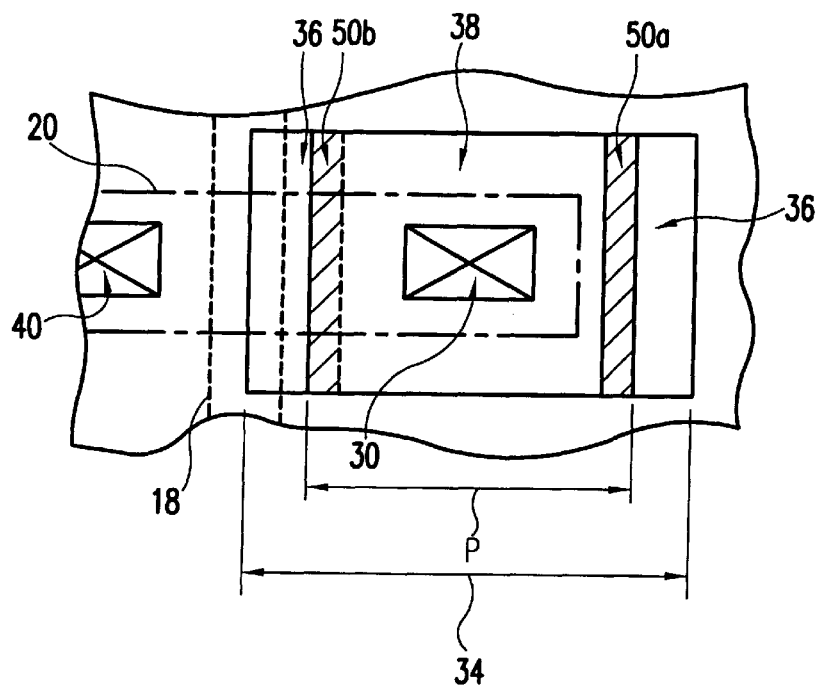
FIG. 7 is a view showing a planar configuration of the capacitor structure shown in FIG. 6.

FIG. 7 is a view principally showing the relationship of placement between the capacitor region 34 and each transfer transistor 20 employed in the present embodiment and a planar configuration of the storage node 32 to describe the capacitor structure employed in the second embodiment.

Outer edges of the on-film extending portion 36 constituting the storage node 32 employed in the second embodiment first define the capacitor region 34. The on-film extending portion 36 and the fin-shaped electrode portion 38 are connected to each other at two connecting portions 50a and 50b (corresponding to diagonally-shaded portions in FIG. 7). The connecting portion 50a is located relative to the drain contact hole 30, on the upper surface of the on-film extending portion 36 on the side opposite to the on-film extending portion 36 on the bit line contact hole 40 side. The connecting portion 50b is located relative to the drain contact hole 30, on the surface of the on-film extending portion 36 on the bit line contact hole 40 side. Both ends of the fin-shaped electrode portion 38 whose cross-section is the inverse U-shaped frame, are connected to these connecting portions 50a and 50b. The aforementioned roof portion of the fin-shaped electrode portion 38 exists between the connecting portions 50a and 50b in a state of being spaced away from the on-film extending portion 36. A region (corresponding to a region designated at symbol p in FIG. 7) occupied by the fin-shaped electrode portion 38, is formed as a region provided within the capacitor region 34 and smaller than the capacitor region 34 in a manner similar to the configuration according to the first embodiment.

In the second embodiment, the fin-shaped electrode portion 38 is formed within the capacitor region 34 so as to occupy the region smaller than the capacitor region 34. Namely, the region in which the fin-shaped electrode portion 38 does not extend, exists within the capacitor region 34.

In the capacitor region 34 in which no fin-shaped electrode portion 38 extends, the thickness of each memory cell is reduced by the thickness of the fin-shaped electrode portion 38. Namely, the thickness of the memory cell on the bit line contact hole side can be reduced by adjusting the region in which the fin-shaped electrode portion 38 extends. Thus, since the bit line contact hole 40 can be rendered small in depth by adjusting the configuration of the fin-shaped electrode portion 38, an aspect (depth-to-diameter) ratio of the contact hole 40 can be reduced.

In order to reduce the aspect ratio of the bit line contact hole 40, the portion of the fin-shaped electrode portion 38, which extends on the bit line contact hole 40 side, may be configured so as to be included within a region in which the on-film extending portion 36 extends as in the capacitor structure shown in FIGS. 5 and 6. This configuration allows a reduction in the thickness of the memory cell (DRAM cell) on the bit line contact hole 40 side. Thus, the aspect ratio of the bit line contact hole 40 can be reduced and each bit line 46 is easy to be formed.

Thus, according to the capacitor structure employed in the second embodiment as described above, the electric capacity Cs of the capacitor increases and the aspect ratio of the bit line contact hole 40 is reduced.

Figure 17A:
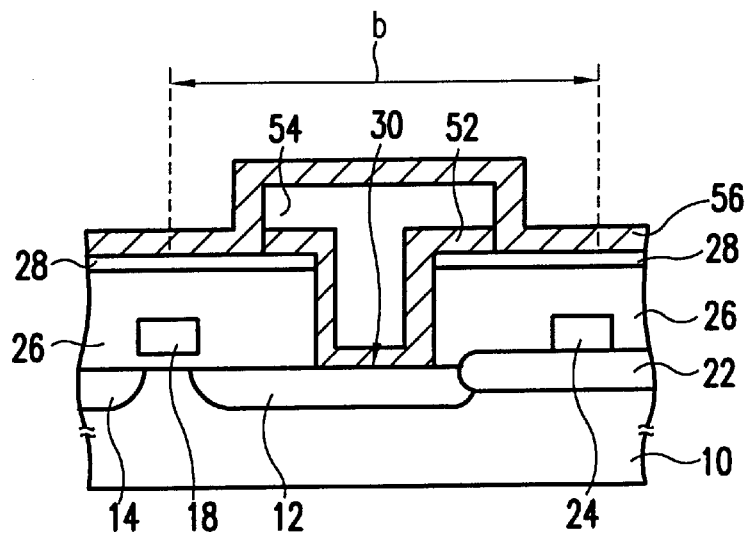
FIG. 17 is a view depicting a manufacturing process employed in the second embodiment of the present invention.
Figure 17B:
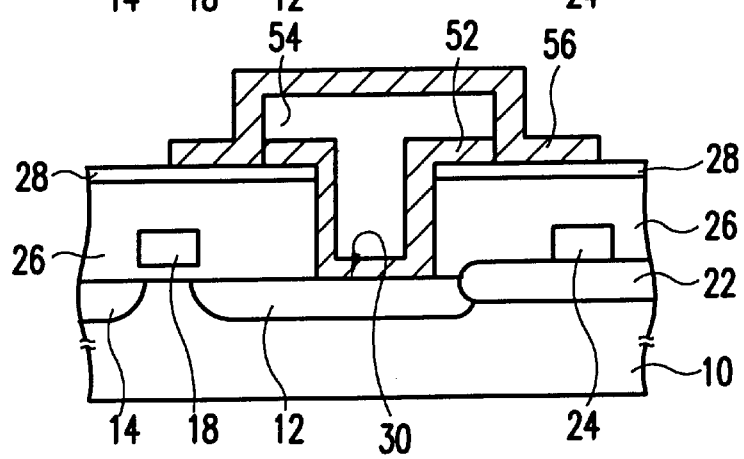

A method of forming the capacitor structure employed in the second embodiment will next be described with reference to FIGS. 17 and 18. FIGS. 17 and 18 are respectively cross-sectional views showing processes for forming the capacitor structure employed in the second embodiment. Incidentally, the process for forming the capacitor structure employed in the second embodiment is different from that used in the first embodiment in how to pattern the second polysilicon layer employed in the first embodiment. In the second embodiment, a second polysilicon layer 56 adjoining side portions of a first polysilicon layer 52 and a first PSG film 54 on the side near the bit line contact hole 40, a second polysilicon layer 56 adjoining side portions of the first polysilicon layer 52 and the first PSG film 54 on the side far from the bit line contact hole 40, and a region (corresponding to a region designated at symbol b in FIG. 17(A) showing a process chart equivalent to FIG. 15(B)) of the second polysilicon layer 56, which linearly extends between the second polysilicon layers 56 adjacent to these side portions, are patterned so as to remain with the drain contact hole 30 interposed between the second polysilicon layers 56. As shown in FIG. 17(B), the remaining portions cover the upper surface of the first PSG film 54 and the two side portions but do not cover side portions of the first PSG film 54, which are other than these side portions.

Figure 17C:
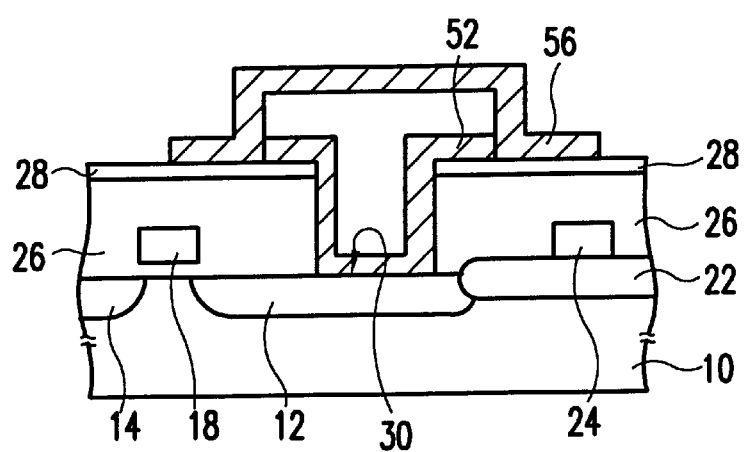
Figure 18A:
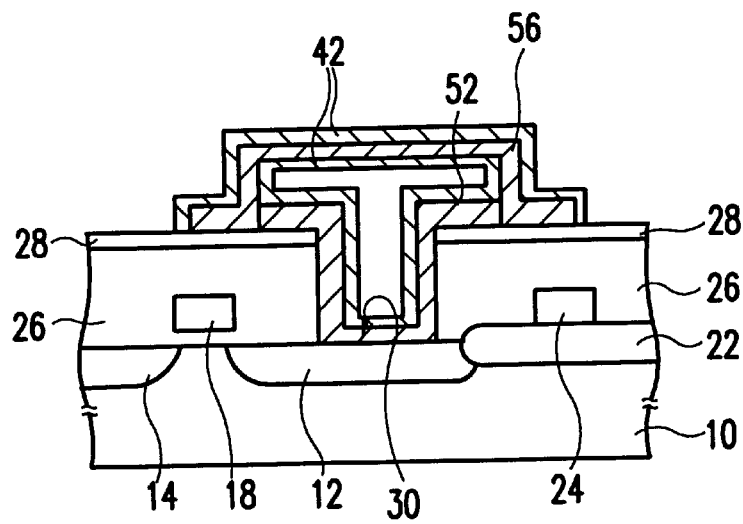
FIG. 18 is a view showing another manufacturing process employed in the second embodiment, which follows the manufacturing process shown in FIG. 17.
Figure 18B:
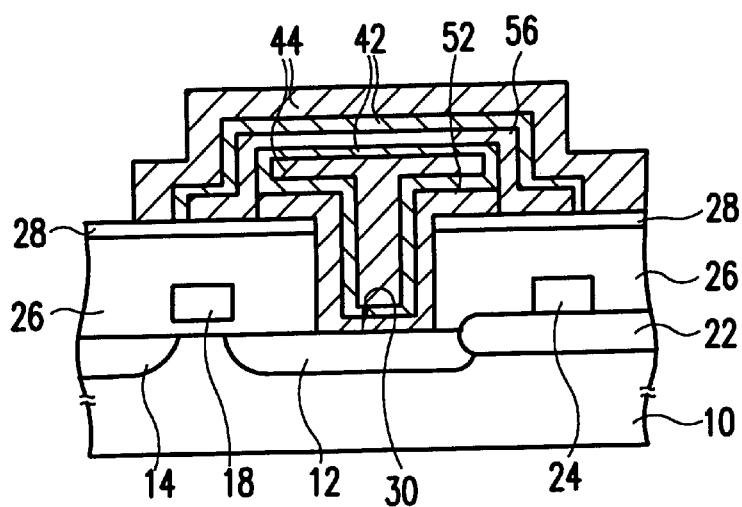

Next, the portions of the first PSG film 54, which are not covered with the second polysilicon layer 56, are subjected to etching. The first PSG film 54 is removed by this etching as shown in FIG. 17(C). Next, a capacitor nitride film 42 is formed on an exposed surface of each of the first and second polysilicon layers 52 and 56 as shown in FIG. 18(A). A cell plate film is then formed on each capacitor nitride film 42 and thereafter patterned as a cell plate 44 as shown in FIG. 18(B).

According to the above-described forming processes, the capacitor structure (see FIG. 5) employed in the second embodiment can be formed.

[Third Embodiment]

Figure 8:
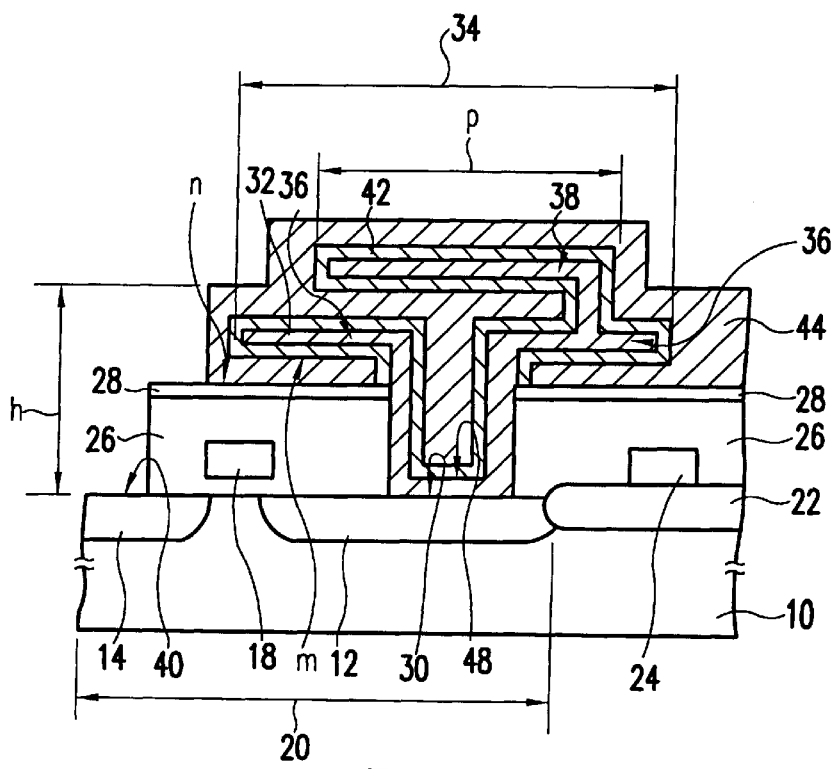
FIG. 8 is a view illustrating a configuration of a DRAM cell according to a third embodiment of the present invention.

FIG. 8 is a view showing a configuration of a DRAM cell according to a third embodiment of the present invention. The present drawing is a cross-sectional view of a cut area of the DRAM cell, which is cut away and shown at a position including a region in which bit lines, a transfer transistor and a capacitor are formed. Incidentally, the same elements of structure as those employed in the first embodiment will not be described.

A fin-shaped electrode portion 38 of a storage node 32 employed in the third embodiment is provided so as to project from an on-film extending portion 36 and occupy a region (corresponding to a region designated at symbol p in FIG. 8) placed within a capacitor region 34 and smaller than the capacitor region 34.

The DRAM cell according to the third embodiment is a semiconductor memory device wherein a bit line is electrically connected to a source region 14 through a bit line contact hole 40 defined for an interlayer insulator 26. At this time, the fin-shaped electrode portion 38 employed in the present embodiment is provided away from an on-film extending portion 36 on the bit line contact hole 40 side in a manner similar to the first embodiment. As described in the first embodiment, the fin-shaped electrode portion 38 may be shaped in the form of a hood which protrudes from the on-film extending portion 36 on the side opposite to the on-film extending portion 36 on the bit line contact hole 40 side and extends away from the on-film extending portion 36 toward the bit line contact hole 40. Thus, the storage node 32 employed in the third embodiment is identical in shape to that (see FIG. 3) in the configuration of the first embodiment. Further, the planar placement of the storage node 32 is also identical to that (see FIG. 4) in the configuration of the first embodiment.

The third embodiment has a structure in which a lower surface (corresponding to a surface indicated by arrow m in FIG. 8, for example) of the on-film extending portion 36 is spaced away from an upper surface (corresponding to a surface indicated by arrow n in FIG. 8, for example) of the interlayer insulator 26. Further, a capacitor nitride film 42 is also formed on the lower surface of the on-film extending portion 36. Therefore, the area of a capacitor can be broadened by the area of the lower surface of the on-film extending portion 36 as compared with the first embodiment. Thus, the electric capacity Cs of the capacitor becomes also great by an increase in the capacitor area.

In the capacitor structure employed in the third embodiment, a region occupied by the fin-shaped electrode portion 38 is smaller than the capacitor region 34. Therefore, a region in which no fin-shaped electrode portion 38 extends, exists within the capacitor region 34.

In the capacitor region 34 in which no fin-shaped electrode portion 38 extends, each memory cell can be reduced in thickness. The thickness of the memory cell on the bit line contact hole side can be reduced by setting the region in which the fin-shaped electrode portion 38 extends. Thus, the bit line contact hole 40 can be rendered shallow in depth, so that an aspect (depth-to-diameter) ratio of the contact hole 40 can be reduced.

As in the case of the capacitor structure shown in FIGS. 8 and 3, it is preferable to achieve separation between the fin-shaped electrode portion 38 and the on-film extending portion 36 on the bit line contact hole 40 side, and place the fin-shaped electrode extending region within the capacitor region 34 and set it smaller than the capacitor region 34 with a view toward reducing the aspect ratio of the bit line contact hole 40.

Thus, according to the capacitor structure employed in the third embodiment, the electric capacity Cs of the capacitor becomes large and the aspect ratio of the bit line contact hole becomes small.

A method of forming the capacitor structure employed in the third embodiment will next be described with reference to FIGS. 19 through 22. FIGS. 19 through 22 are respectively cross-sectional views showing processes of manufacturing the capacitor structure employed in the third embodiment. Elements of structure, which have been described in the forming processes employed in the first embodiment are identified by the same reference numerals, and the description of their materials and forming methods might therefore be omitted.

Figure 19A:
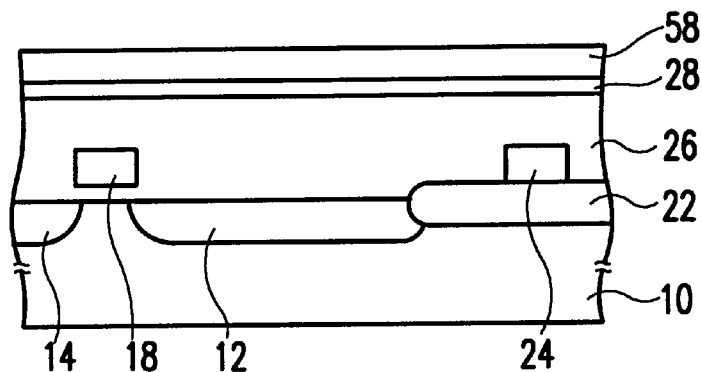
FIG. 19 is a view illustrating a manufacturing process employed in the third embodiment of the present invention.

As shown in FIG. 19(A), an interlayer insulator 26, a stopper nitride film 28 and a second sacrifice film are first successively stacked on a Si semiconductor substrate 10 with a drain region 12 and a source region 14 formed therein.

A second PSG film 58 is used as the second sacrifice film in the present embodiment. The second PSG film 58 utilizes PSG as its material and is formed so as to range from 1000 Å to 2000 Å in thickness by the CVD process.

Figure 19B:
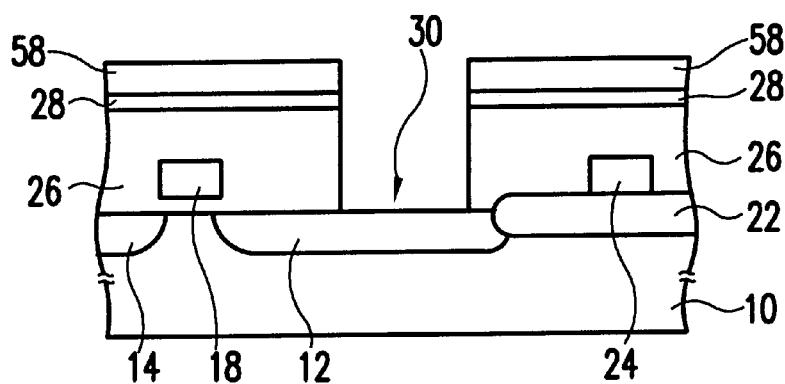

Next, a drain contact hole 30 is defined in the interlayer insulator 26, the stopper nitride film 28 and the second PSG film 58 above the drain region 12 as shown in FIG. 19(B).

According to this process step, the drain contact hole 30 for exposing the drain region 12 through an aperture or opening defined therein is defined.

Figure 19C:
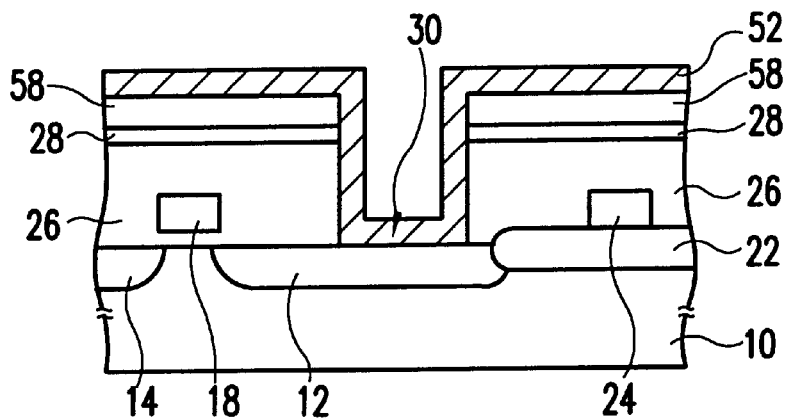

Next, a first storage node film (first polysilicon layer 52) is formed over the upper surface of the second PSG film 58 and the drain region 12 exposed from the drain contact hole 30 as shown in FIG. 19(C).

As described in the first embodiment, the first polysilicon layer 52 has been filled with impurities and subjected to heat treatment.

Figure 20A:
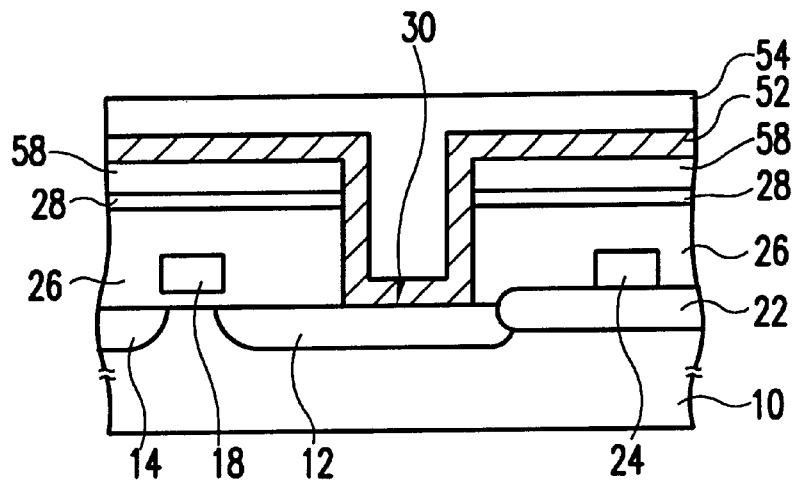
FIG. 20 is a view depicting another manufacturing process employed in the third embodiment, which follows the manufacturing process shown in FIG. 19.

Next, a first sacrifice film (first PSG film 54) is formed on the upper surface of the first polysilicon layer 52 as shown in FIG. 20(A).

The first PSG film 54 is stacked on the first polysilicon layer 52 to fill the drain contact hole 30 therewith.

Figure 20B:
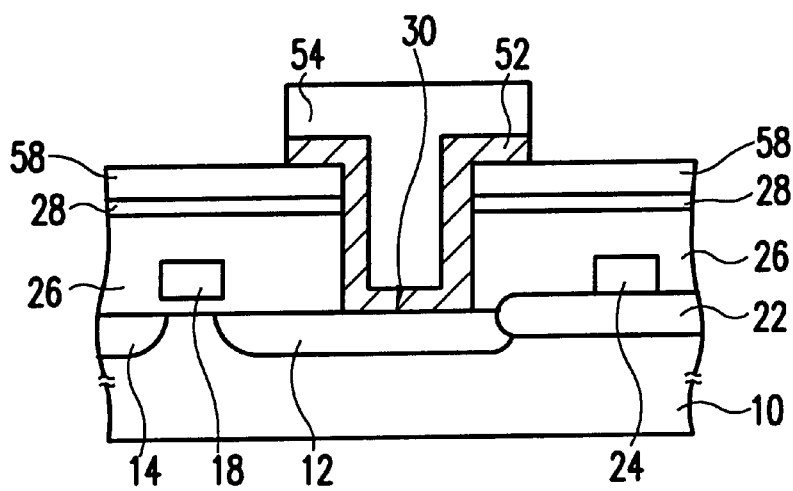

Next, the first PSG film 54 and the first polysilicon layer 52 are patterned as shown in FIG. 20(B).

In the present process step, the first PSG film 54 and the first polysilicon layer 52 on a region wider than a region in which the drain contact hole 30 is defined, are subjected to patterning so as to remain.

Figure 20C:
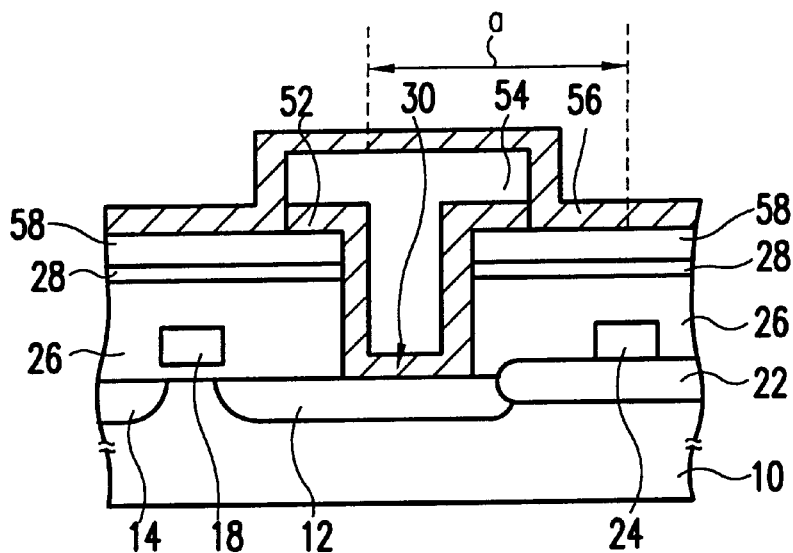

Next, the patterned first PSG film 54 and first polysilicon layer 52 are covered with a second storage node material film (second polysilicon layer 56) as shown in FIG. 20(C).

The second polysilicon layer 56 is stacked on the surfaces of the first PSG film 54, first polysilicon layer 52 and stopper nitride film 28. As has been described in the forming process employed in the first embodiment, phosphorus is allowed to diffuse into the second polysilicon layer 56. Phosphorus glass formed on the surface of the second polysilicon layer 56 is removed by HF etching.

Next, the second polysilicon layer 56 is patterned to expose the first PSG film 54 as shown in FIG. 21(A).

In the present process step, the second polysilicon layer 56 is removed to expose the first PSG film 54 located on the definition side of a bit line contact hole 40. Namely, the second polysilicon layer 56 is removed by the above patterning so that a portion (corresponding to a region designated at symbol a in FIG. 20(C)) of the second polysilicon layer 56, which contacts one side of the first polysilicon layer 52 and extends on the upper side of the fist polysilicon layer 52, remains.

Next, the first PSG film 54 is removed as shown in FIG. 21(B).

In the present process step, etching is done from a portion of the first PSG film 54, which has been exposed from the second polysilicon layer 56 to thereby remove all of the first PSG film 54.

Next, the second PSG film 58 is removed as shown in FIG. 21(C).

In the present embodiment, the same PSG film is used as for both the first and second PSG films 54 and 58. In practice, the process step shown in FIG. 21(C) is carried out simultaneously with the process step shown in FIG. 21(B) described previously. These first and second PSG films 54 and 58 may preferably be removed by the HF etching or isotropic dry etching as has been described in the manufacturing process employed in the first embodiment. Thus, the removal of the second PSG film 58 allows separation between the lower surfaces of the first and second polysilicon layers 52 and 56 and the upper surface of the stopper nitride film 28.

Figure 22A:
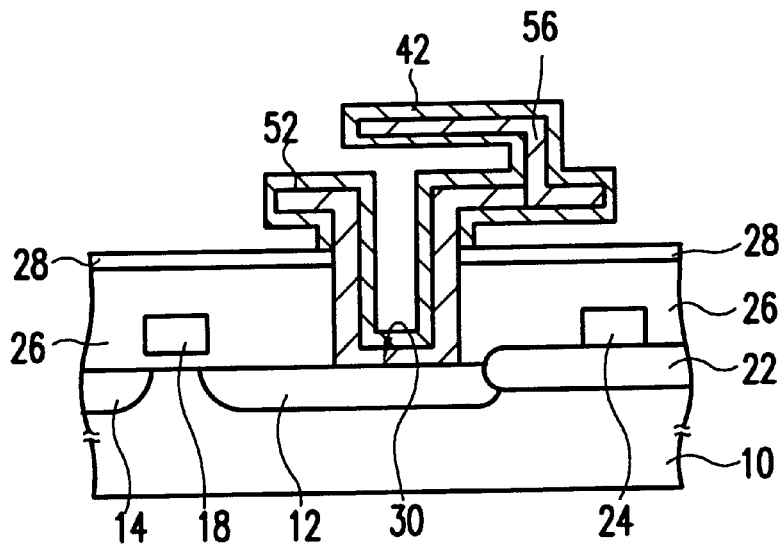
FIG. 22 is a view depicting a still further manufacturing process employed in the third embodiment, which follows the manufacturing process shown in FIG. 21.

Next, the capacitor nitride film 42 is formed on the surfaces of the first and second polysilicon layers 52 and 56 as shown in FIG. 22(A).

According to the present process step, the capacitor nitride film 42 is formed on the exposed surfaces of the first and second polysilicon layers 52 and 56.

Figure 22B:
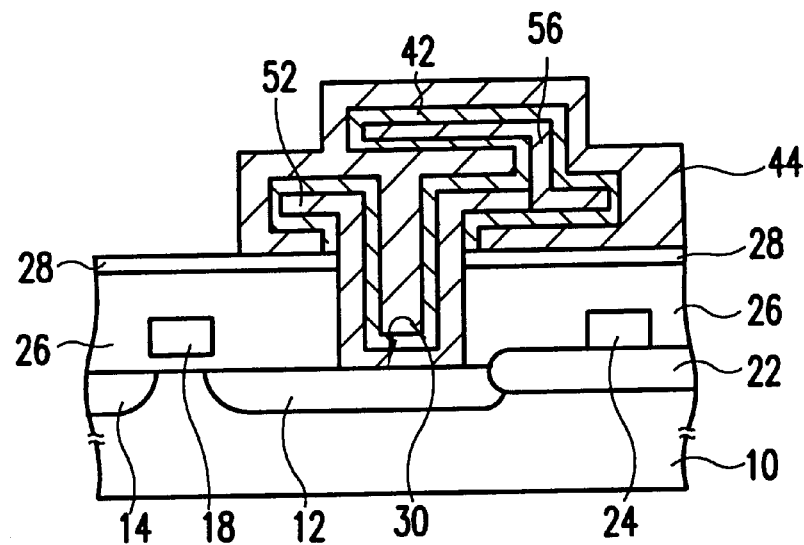

A cell plate film is then formed on the capacitor nitride film 42 as shown in FIG. 22(B).

In the present process step, the cell plate film is stacked so as to cover both the storage node composed of the first and second polysilicon layers 52 and 56 and the capacitor nitride film 42. Thereafter, the stacked cell plate film is patterned as a cell plate 44.

According to the manufacturing processes described above, the capacitor structure (see FIG. 8) employed in the third embodiment can be formed. According to the manufacturing processes as well, since the second polysilicon layer 56 used as the aforementioned second storage node film is patterned as described in the process step shown in FIG. 21(A), etchant is easy to enter round and the first PSG film 54 used as the first sacrifice film is easy to execute its etching in the subsequent process step shown in FIG. 21(B).

[Fourth Embodiment]

Figure 9:
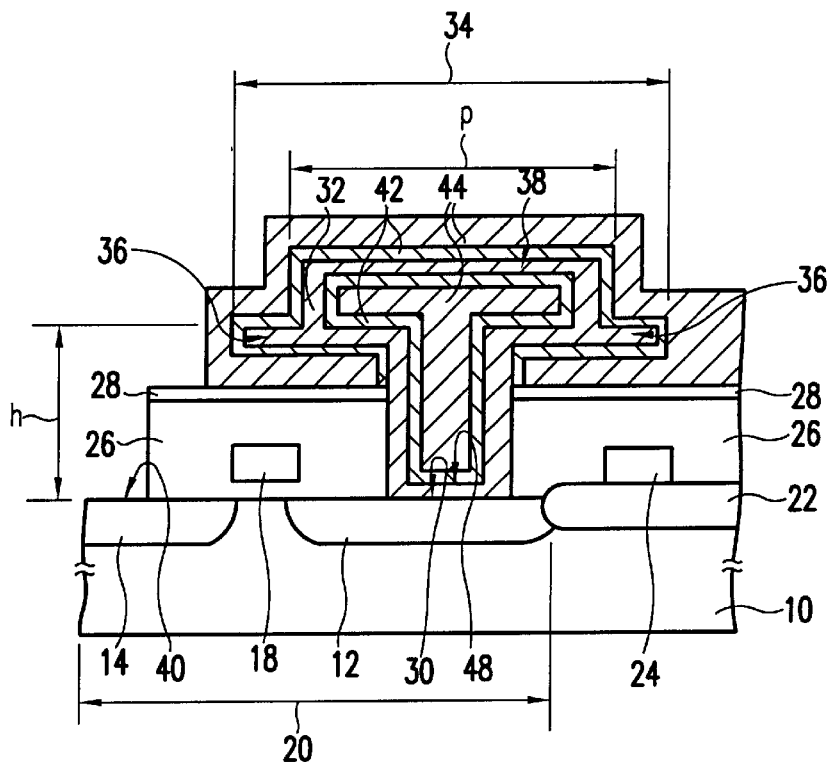
FIG. 9 is a view depicting a configuration of a DRAM cell according to a fourth embodiment of the present invention.

FIG. 9 is a view showing a configuration of a DRAM cell according to a fourth embodiment of the present invention. The present drawing is a cross-sectional view of a cut area of the DRAM cell, which is cut away and shown at a position including a region in which a transfer transistor and a capacitor are formed. Incidentally, the description of the same elements of structure as those employed in the respective embodiments referred to above might be omitted.

In a capacitor structure employed in the fourth embodiment, a storage node 32 is identical in shape to that of the capacitor structure (see FIGS. 5 and 6) employed in the second embodiment. The capacitor structure employed in the fourth embodiment is different from that employed in the second embodiment in that a lower surface of an on-film extending portion 36 is spaced away from an upper surface of an interlayer insulator 26 (see FIG. 9). If the capacitor structure is constructed in this way, then the area of the capacitor can be increased by the surface area of the lower surface of the on-film extending portion 36 as has been described in the third embodiment. Thus, the electric capacity Cs of the capacitor becomes great by the increase in the capacitor area as compared with the capacitor structure employed in the second embodiment.

According to the capacitor structure employed in the fourth embodiment, since a region in which no fin-shaped electrode portion 38 extends, is formed so as to face a bit line contact hole 40, the bit line contact hole 40 can be defined shallow in depth. Thus, the bit line contact hole 40 can be reduced in aspect ratio.

A method of forming the capacitor structure employed in the fourth embodiment will next be described with reference to FIGS. 23 and 24. FIGS. 23 and 24 are respectively cross-sectional views showing processes for forming the capacitor structure employed in the fourth embodiment. Incidentally, the fourth embodiment is identical in other process steps to the third embodiment except that the process step for removing the second polysilicon layer 56, which is executed in the third embodiment, is different from that to be executed in the fourth embodiment. The fourth embodiment differs from the third embodiment in how to perform patterning in this removing process step.

Figure 23A:
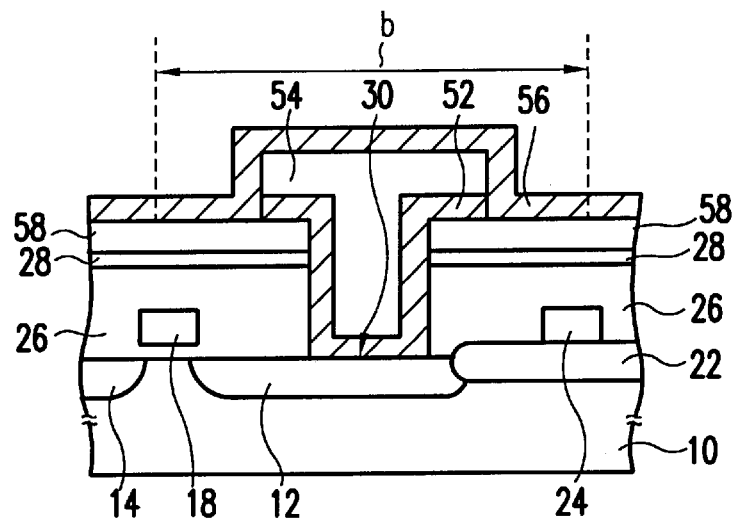
FIG. 23 is a view showing a manufacturing process employed in the fourth embodiment of the present invention.
Figure 23B:
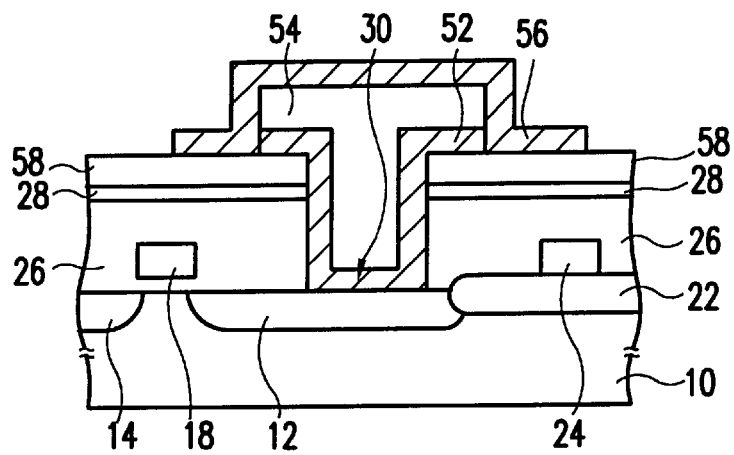

The process step for removing the second polysilicon layer 56 employed in the fourth embodiment corresponds to a process step for patterning a second polysilicon layer 56 adjoining side portions of a first polysilicon layer 52 and a first PSG film 54 on the side near the bit line contact hole 40, a second polysilicon layer 56 adjoining side portions of the first polysilicon layer 52 and the first PSG film 54 on the side far from the bit line contact hole 40, and a region (corresponding to a region designated at symbol b in FIG. 23(A) showing a process chart equivalent to FIG. 20(C)) of the second polysilicon layer 56, which linearly extends between the second polysilicon layers 56 adjoining these side portions, such that they remain with a drain contact hole 30 interposed between the second polysilicon layers 56. The remaining portions cover the upper surface of the first PSG film 54 and the two side portions, and side portions of the first PSG film 54, which are other than the above-described side portions, are not covered with the second polysilicon layer 56 (see FIG. 23(B)).

Figure 23C:
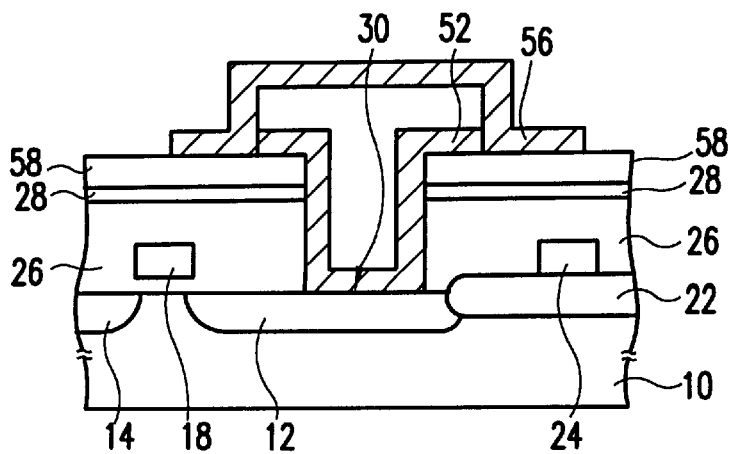
Figure 24A:
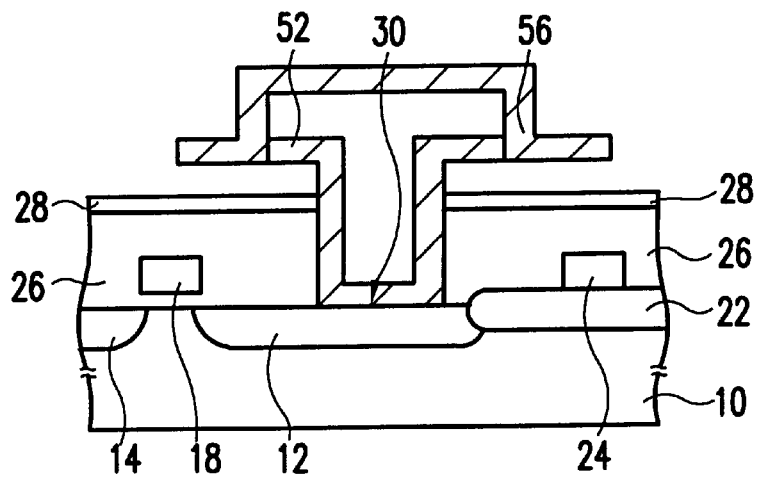
FIG. 24 is a view illustrating another manufacturing process employed in the fourth embodiment, which follows the manufacturing process shown in FIG. 23.

Next, the portions of the first PSG 54, which are not covered with the second polysilicon layer 56, are etched as shown in FIG. 23(C) to remove the first PSG film 54. Thereafter, a second PSG film 58 is removed as shown in FIG. 24(A). As has been described in the third embodiment, the first and second PSG films 54 and 58 may be removed simultaneously.

Figure 24B:
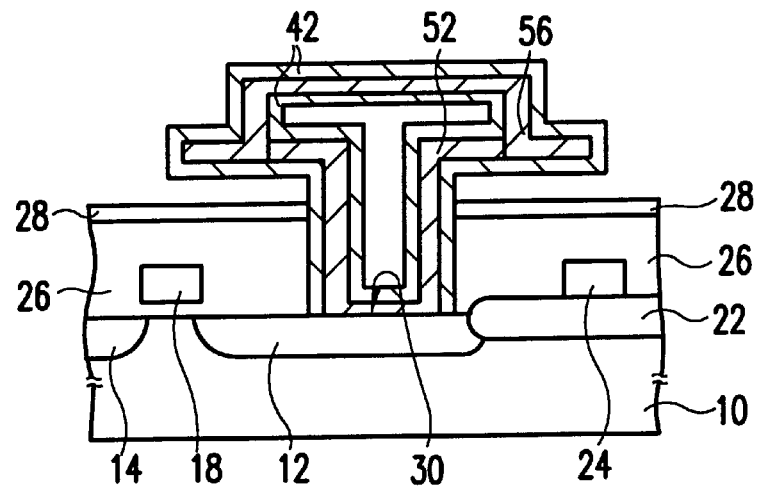
Figure 24C:
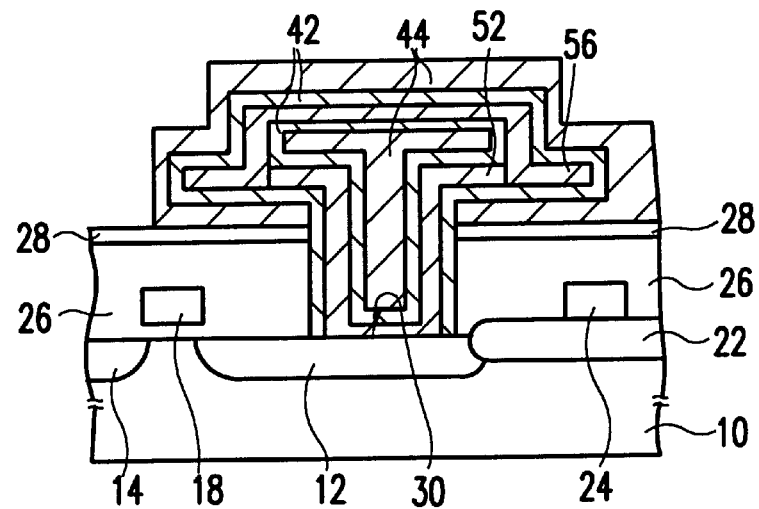

Next, a capacitor nitride film 42 is formed on an exposed surface of each of the first and second polysilicon layers 52 and 56 as shown in FIG. 24(B). A cell plate film is then formed on each capacitor nitride film 42 and thereafter patterned as a cell plate 44, as shown in FIG. 24(C).

According to the above-described forming processes, the capacitor structure (see FIG. 9) employed in the fourth embodiment can be formed.

[Fifth Embodiment]

Figure 10:
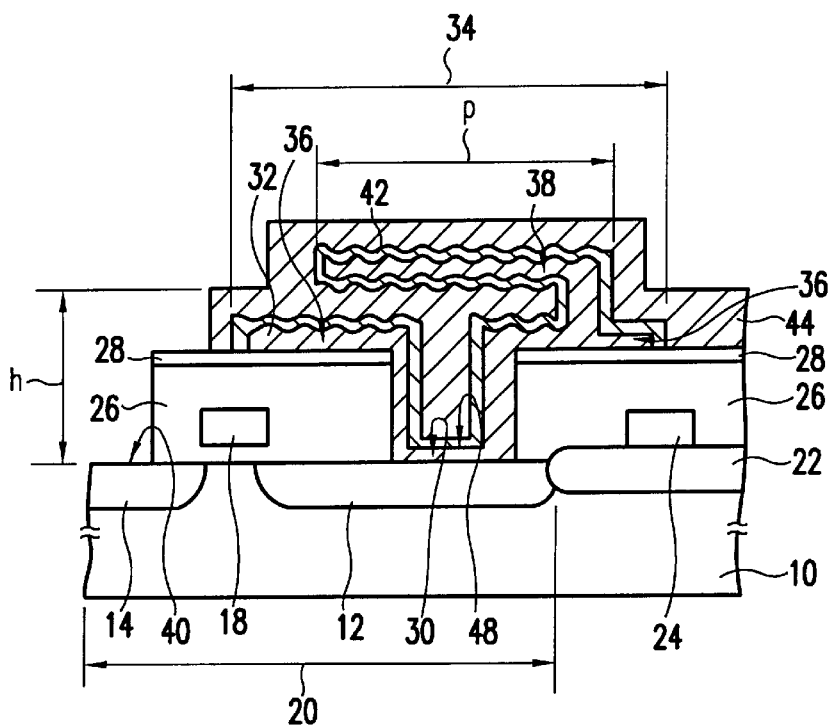
FIG. 10 is a view showing a configuration of a DRAM cell according to a fifth embodiment of the present invention.

FIG. 10 is a view showing a configuration of a DRAM cell according to a fifth embodiment of the present invention. The present drawing is a cross-sectional view of a cut area of the DRAM cell, which is cut away and shown at a position including a region in which a transfer transistor and a capacitor are formed. Incidentally, the description of the same elements of structure as those employed in the aforementioned respective embodiments might be omitted.

A capacitor structure employed in the fifth embodiment is configured so that the surface of the storage node 32 of the capacitor structure described in the first embodiment has irregularities. Projections and depressions or irregularities are principally formed on the surface thereof on which a capacitor nitride film 42 is formed. Thus, the area of the capacitor of the capacitor structure employed in the fifth embodiment is large by the irregularities as compared with the capacitor structure employed in the first embodiment. Thus, the electric capacity Cs of the capacitor in the capacitor structure employed in the fifth embodiment is large by an increase in the capacitor area.

A method of forming the capacitor structure employed in the fifth embodiment will next be described with reference to FIGS. 25 through 27. FIGS. 25 through 27 are respectively cross-sectional views showing processes for forming the capacitor structure employed in the fifth embodiment. Incidentally, process steps up to a process step for forming a first polysilicon, which will be described later, are identical to those employed in the first embodiment.

As shown in FIG. 14(A), the interlayer insulator 26 and the stopper nitride film 28 are first successively stacked on the Si semiconductor substrate 10 with the drain region 12 and the source region 14 formed therein.

Next, the drain contact hole 30 is defined in the interlayer insulator 26 and the stopper nitride film 28 located above the drain region 12 as shown in FIG. 14(B).

Next, the first polysilicon layer 52 is formed over the upper surface of the stopper nitride film 28 and the drain region 12 bared or exposed from the drain contact hole 30 as illustrated in FIG. 14(C).

Figure 25A:
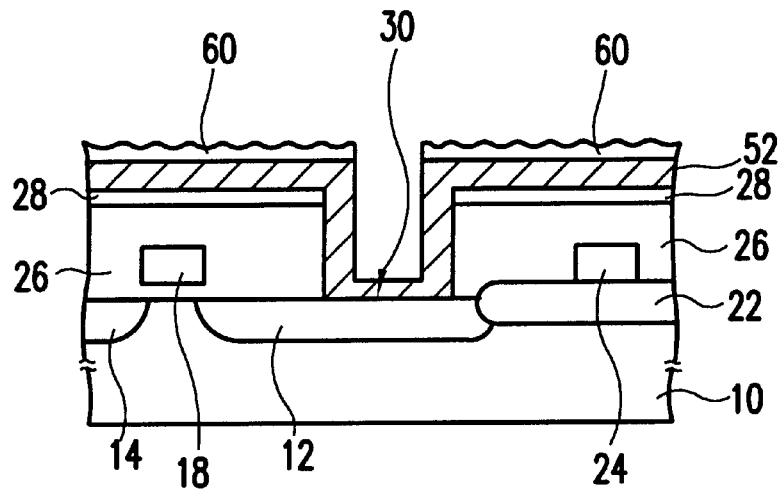
FIG. 25 is a view depicting a manufacturing process employed in the fifth embodiment of the present invention.

A rough surface film is then formed on the upper surface of the first polysilicon layer 52 formed on the upper surface of the stopper nitride film 28 as shown in FIG. 25(A).

A rough-surface polysilicon layer 60 whose surface has projections and depressions or irregularities, is used as the rough surface film. The rough-surface polysilicon layer 60 can be produced by controlling producing or forming conditions (temperature and pressure) for the polysilicon layer. For example, the CVD process is carried out at a temperature of 575° C. and under a pressure of 0.20 Torr, so that a rough-surface polysilicon layer ranging from 500 Å to 2000 Å in thickness can be formed. Further, impurities are injected into the rough-surface polysilicon layer 60 to improve its conductivity.

Figure 25B:
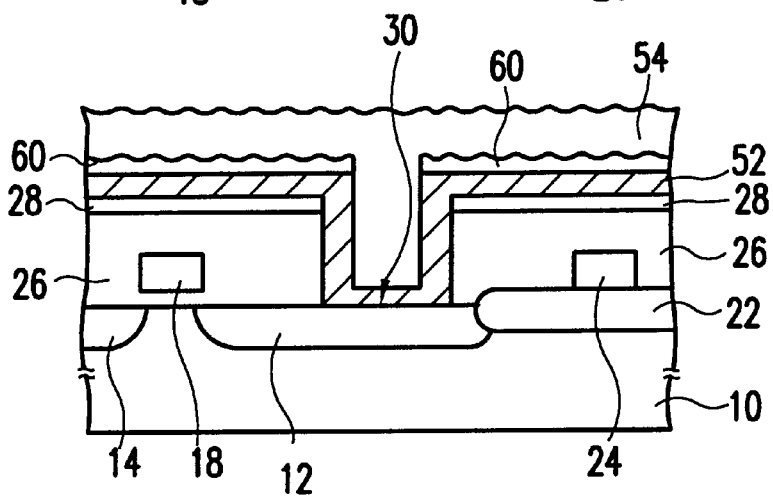

Next, a first PSG film 54 is formed on the upper surfaces of the rough-surface polysilicon layer 60 and the first polysilicon layer 52 as shown in FIG. 25(B).

The first PSG film 54 is formed so as to range from 1000 Å to 2000 Å in thickness as has been described in the manufacturing process executed in the first embodiment. The irregularities of the rough-surface polysilicon layer 60 are reflected on the surface of the first PSG film 54 so that the surface thereof is rendered uneven.

Figure 25C:
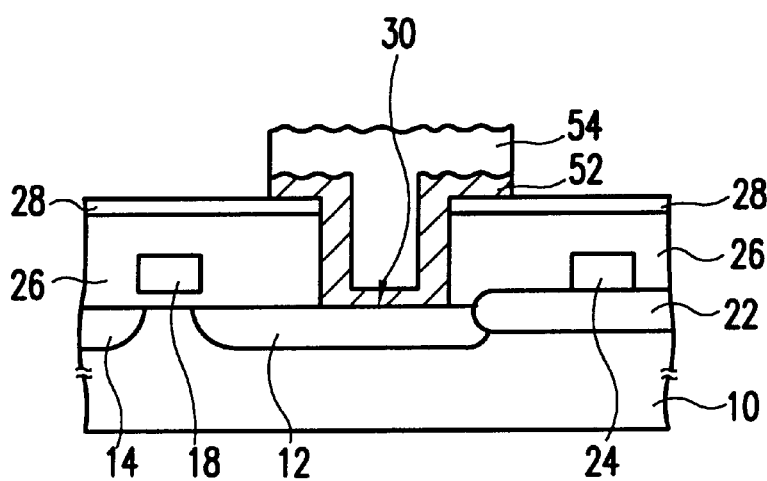

Next, the rough-surface polysilicon layer 60, the first PSG film 54 and the first polysilicon layer 52 are patterned as shown in FIG. 25(C).

Other portions are removed by this patterning so that the rough-surface polysilicon layer 60, the first PSG film 54 and the first polysilicon layer 52 on a region broader than the region in which the drain contact hole 30 is defined, remain. In FIG. 25(C), the rough-surface polysilicon layer 60 and the first polysilicon layer 52 are formed as an integral structure and both shown as the first polysilicon layer 52.

Figure 26A:
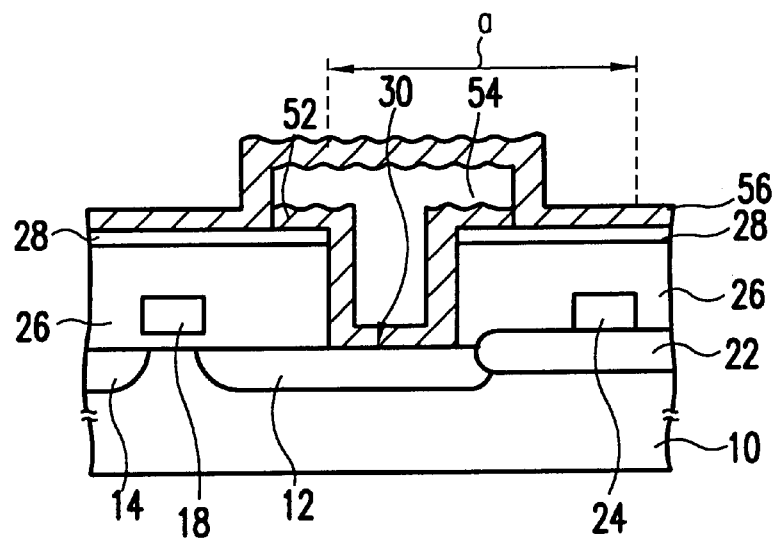
FIG. 26 is a view showing another manufacturing process employed in the fifth embodiment, which follows the manufacturing process shown in FIG. 25.

Next, the patterned rough-surface polysilicon layer 60, first PSG film 54 and first polysilicon layer 52 are covered with a second polysilicon layer 56 as shown in FIG. 26(A).

The surface of the second polysilicon layer 56 stacked on the upper surface of the first PSG film 54 has a shape on which the irregularities of the first PSG film 54 are reflected.

Figure 26B:
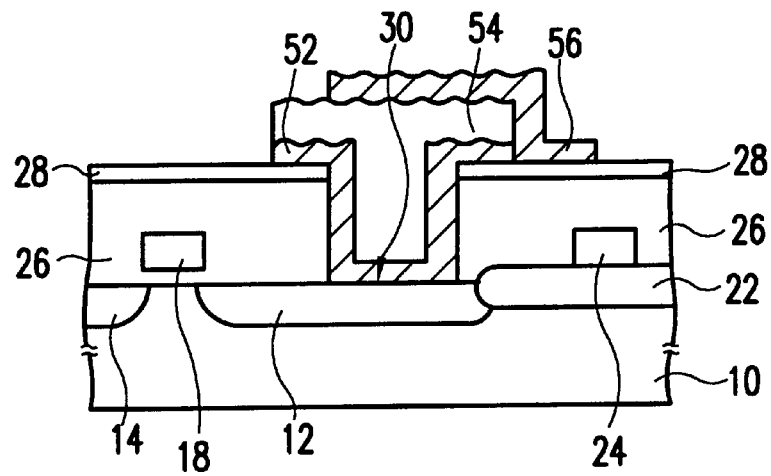

Next, the second polysilicon layer 56 is patterned so as to expose the first PSG film 54 as shown in FIG. 26(B).

This patterning is performed so as to remove the second polysilicon layer 56 on the definition side of a bit line contact 40. Namely, the portion of another second polysilicon layer is removed so that the second polysilicon layer 56 placed in a region corresponding to a range indicated by symbol a in FIG. 26(A) remains.

Figure 26C:
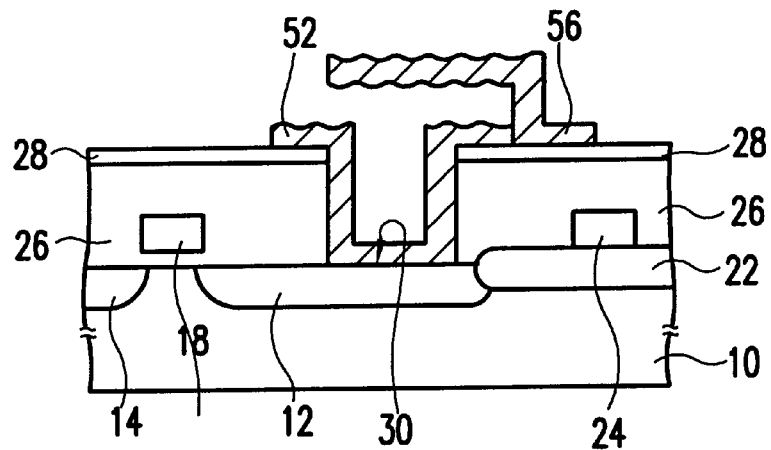

Next, the first PSG film 54 is removed as illustrated in FIG. 26(C).

The removal of all of the first PSG film 54 can provide spacing between the first polysilicon 52 and the second polysilicon layer 56.

Figure 27A:
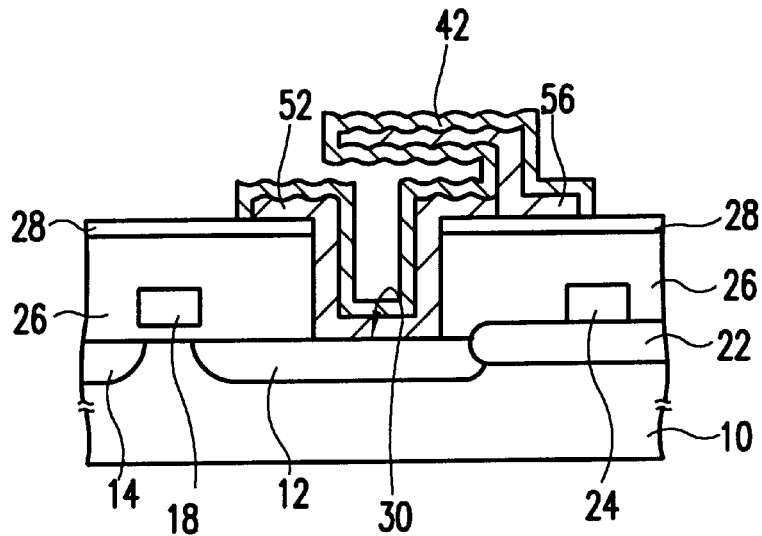
FIG. 27 is a view illustrating a further manufacturing process employed in the fifth embodiment, which follows the manufacturing process shown in FIG. 26.

Next, a capacitor nitride film 42 is formed on the surfaces of the rough-surface polysilicon layer 60 and the first and second polysilicon layers 52 and 56 as shown in FIG. 27(A).

The capacitor nitride film 42 is formed so as to range from 60 Å to 80 Å in thickness. The capacitor nitride film 42 is formed on the first and second polysilicon layers 52 and 56 and the rough-surface polysilicon layer 60 to reflect the irregularities on the surfaces of the first and second polysilicon layers 52 and 56 and rough-surface polysilicon layer 60.

Figure 27B:
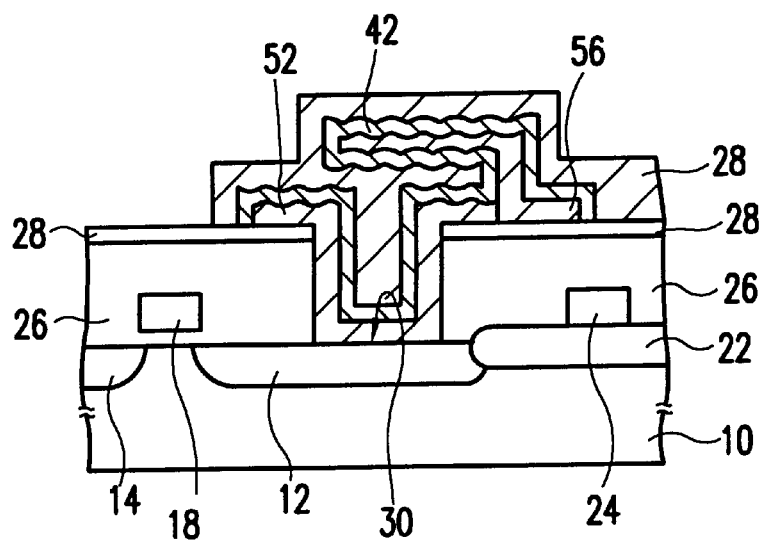

Next, a cell plate film is formed on the capacitor nitride film 42 as shown in FIG. 27(B). The formed cell plate film is subjected to patterning, thus resulting in a cell plate 44.

The capacitor structure employed in the fifth embodiment can be fabricated in accordance with the above-described respective processes. The capacitor structure employed in the fifth embodiment can be fabricated even by another forming method to be described next.

Another method of forming the capacitor structure employed in the fifth embodiment will next be described with reference to FIGS. 28 through 31. FIGS. 28 through 31 are respectively cross-sectional views showing modifications of the manufacturing processes used for the capacitor structure employed in the fifth embodiment.

An interlayer insulator 26, a stopper nitride film 28 and a rough-surface film are first successively stacked on an Si semiconductor substrate 10 with a drain region 12 and a source region 14 formed therein.

Figure 28A:
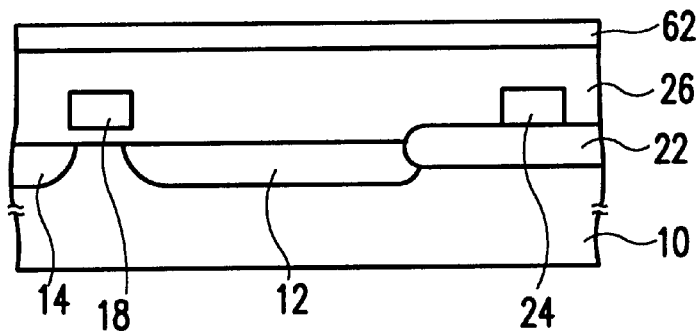
FIG. 28 is a view depicting a modification of the manufacturing process employed in the fifth embodiment.
Figure 28B:
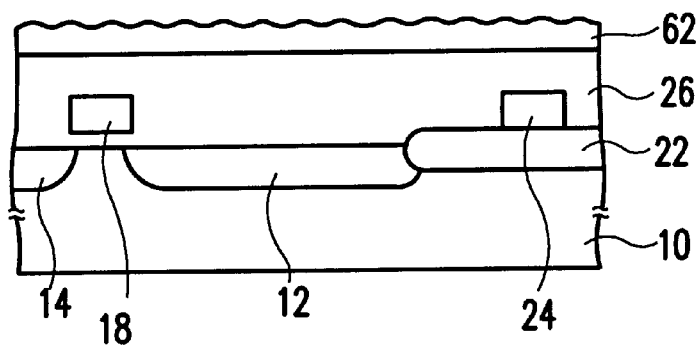
Figure 28C:
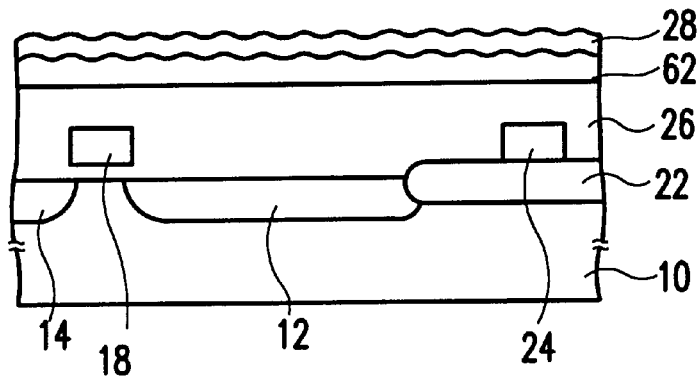

This process is executed in accordance with FIGS. 28(A) through 28(C).

The interlayer insulator 26 and an SOG film 62 are first successively stacked on the Si semiconductor substrate 10 with the drain region 12 and the source region 14 formed therein, as shown in FIG. 28(A).

The SOG (Spin-on-glass) film 62 is applied to the interlayer insulator 26 so as to range from 1000 Å to 2000 Å in thickness.

Next, the SOG film 62 is etched as shown in FIG. 28(B).

In the process step shown in FIG. 28(B), the upper surface of the SOG film 62 is etched by about 200 Å to 500 Å. For example, dry etching may preferably be used as the etching. For example, the SOG film 62 is applied to the interlayer insulator 26 by 1000 Å and an etching time is estimated from an etching rate of SOG. In this condition, the SOG film 62 is etched so that the upper surface thereof is removed by 300 Å. Since SOG includes its surface having the property of being not subjected to uniform etching, a rough surface film whose surface has projections and depressions or irregularities, can be formed.

Next, a stopper nitride film 28 is formed on the etched SOG film 62 as shown in FIG. 28(C).

The stopper nitride film 28 is formed so as to range from 100 Å to 300 Å in thickness. The shape of the surface of the stopper nitride film 28 is turned into irregularities by reflecting irregularities of the SOG film 62 thereon.

Figure 29A:
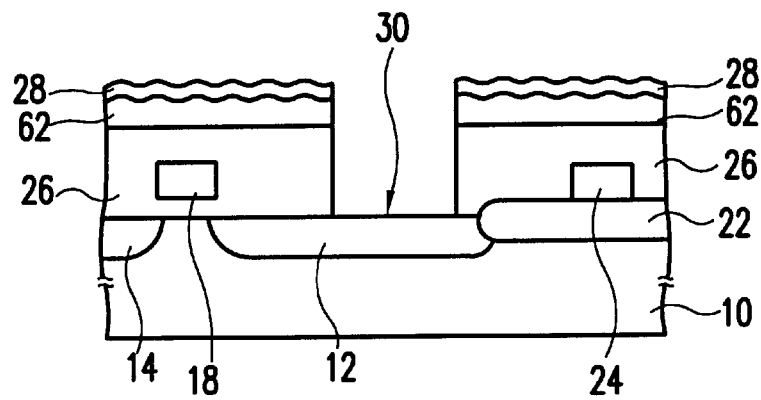
FIG. 29 is a view showing another modification of the manufacturing process employed in the fifth embodiment, which follows the modification shown in FIG. 28.

A drain contact hole 30 is next defined in the interlayer insulator 26, the SOG film 62 and the stopper nitride film 28 provided above the drain region 12, as shown in FIG. 29(A).

The drain contact hole 30 is defined so as to expose the drain region 12 from its aperture or opening.

Figure 29B:
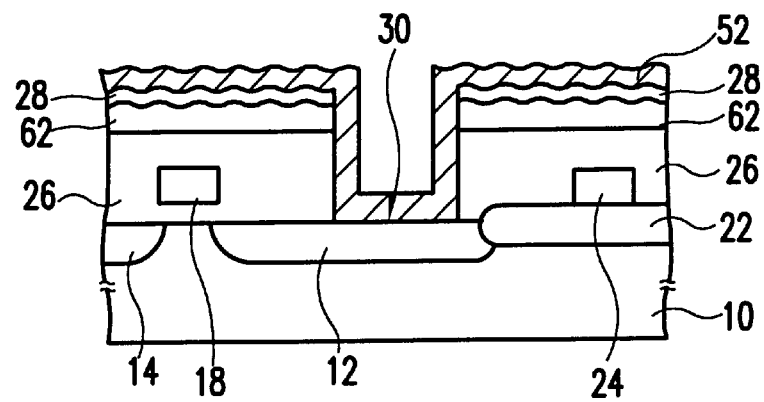

Next, a first polysilicon layer 52 is formed over the upper surface of the stopper nitride film 28 and the drain region 12 exposed from the drain contact hole 30 as shown in FIG. 29(B).

The surface of the first polysilicon layer 52 stacked on the upper surface of the stopper nitride film 28 is turned into a shape on which the irregularities on the surface of the stopper nitride film 28 have been reflected.

Figure 29C:
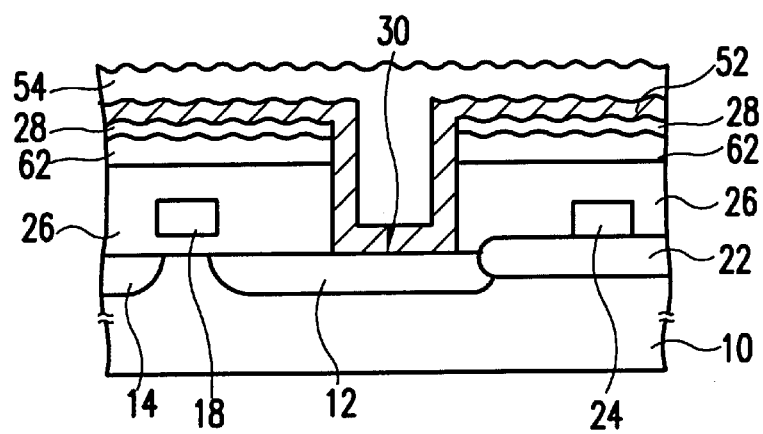

Next, a first PSG film 54 is formed on the upper surfaces of the stopper nitride film 28 and the first polysilicon layer 52 as shown in FIG. 29(C).

The drain contact hole 30 is padded or filled with the first PSG film 54. The surface of the first PSG film 54 is turned into a shape on which irregularities of the first polysilicon layer 52 have been reflected.

Figure 30A:
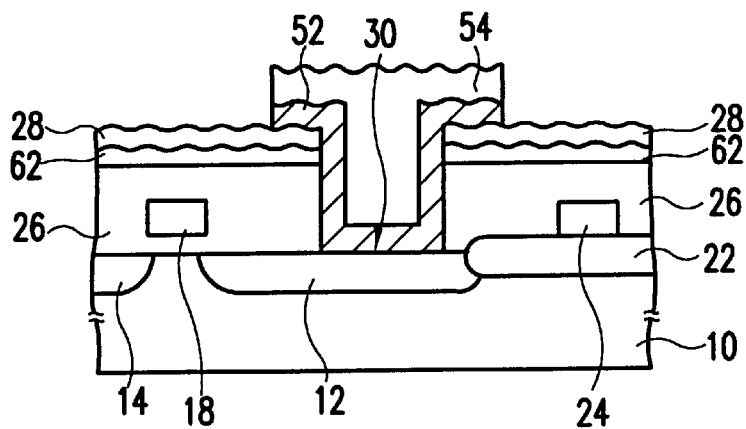
FIG. 30 is a view illustrating a further modification of the manufacturing process employed in the fifth embodiment, which follows the modification shown in FIG. 29.

Next, the first PSG film 54 and the first polysilicon layer 52 are subjected to patterning as shown in FIG. 30(A).

This patterning is carried out so as to leave the first PSG film 54 and the first polysilicon layer 52 on a region wider than the region in which the drain contact hole 30 is defined, and remove other portions.

Figure 30B:
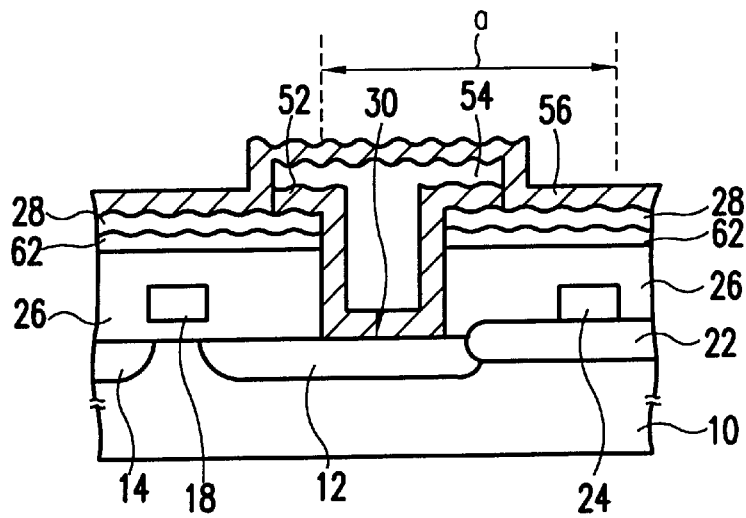

Next, the patterned first PSG film 54 and first polysilicon layer 542 are covered with a second polysilicon layer 56 as shown in FIG. 30(B).

The surface of the second polysilicon layer 56 takes a shape on which irregularities of the first PSG film 54 have been reflected.

Figure 30C:
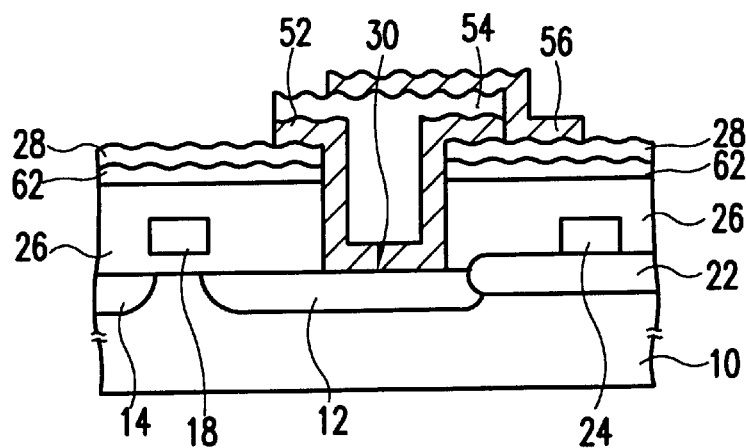

Next, the second polysilicon layer 56 is patterned so as to expose the first PSG film 54 as shown in FIG. 30(C).

This patterning is performed so as to remove the second polysilicon layer 56 on the definition side of a bit line contact hole. Namely, other portions are removed so that a region corresponding to a range indicated by symbol a shown in FIG. 30(B) remains.

Figure 31A:
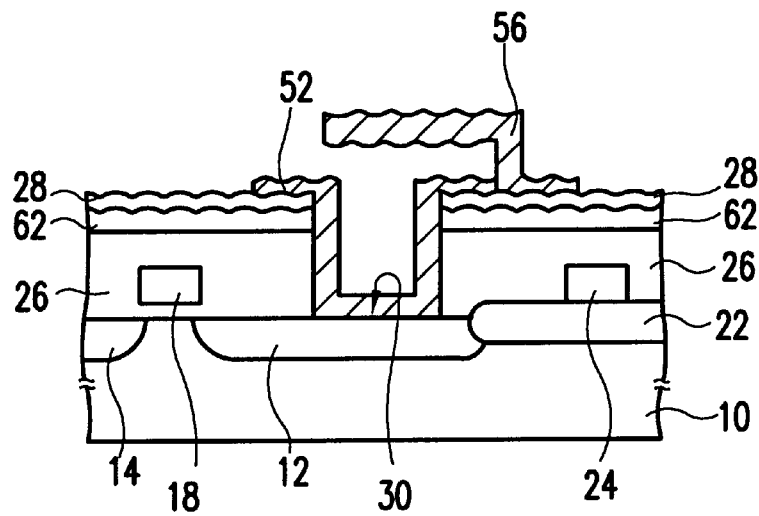
FIG. 31 is a view showing a still further modification of the manufacturing process employed in the fifth embodiment, which follows the modification shown in FIG. 30.

Next, the first PSG film 54 is removed as shown in FIG. 31(A).

According to this process step, all of the fist PSG film 54 is removed, so that spacing is defined between the first and second polysilicon layers 52 and 56.

Figure 31B:
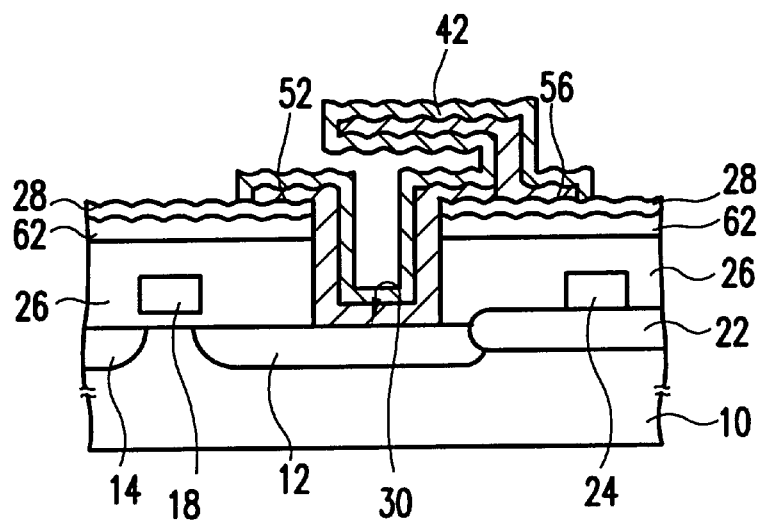

Next, a capacitor nitride film 42 is formed on the surfaces of the first and second polysilicon layers 52 and 56 as shown in FIG. 31(B).

The capacitor nitride film 42 is formed on the exposed surfaces of the first and second polysilicon layers 52 and 56. Further, the surface of the capacitor nitride film 42 takes a shape on which irregularities on the surfaces of the first and second polysilicon layers 52 and 56 have been reflected.

Figure 31C:
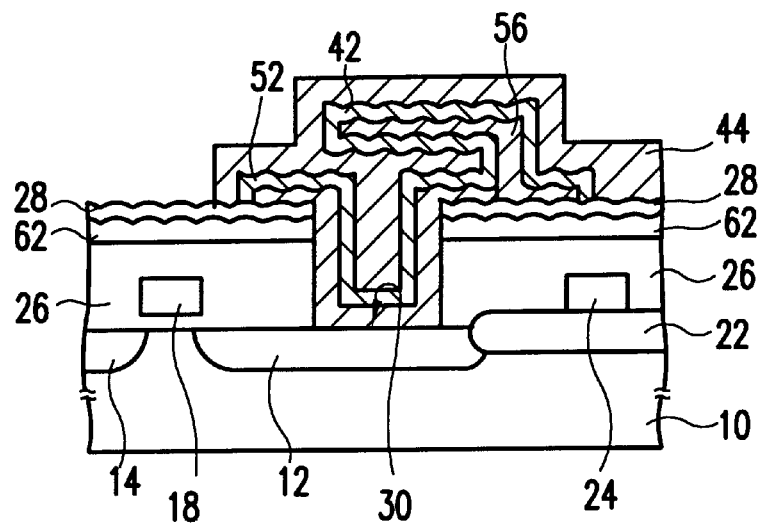

Next, a cell plate film is formed on the capacitor nitride film 42 as shown in FIG. 31(C). The cell plate film is patterned to form a cell plate 44.

According to the above-described processes, the capacitor structure employed in the fifth embodiment is formed.

[Sixth Embodiment]

Figure 11:
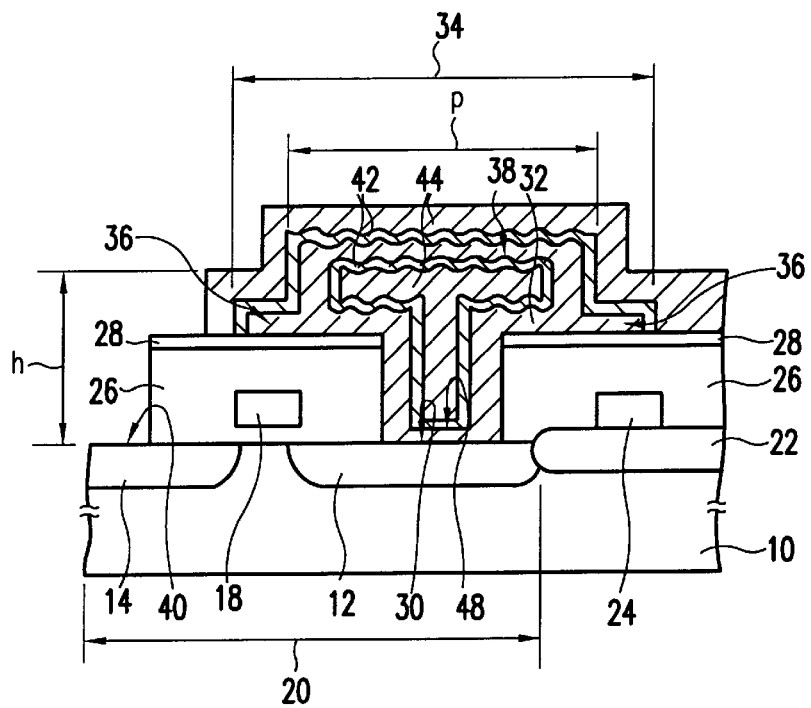
FIG. 11 is a view illustrating a configuration of a DRAM cell according to a sixth embodiment of the present invention.

FIG. 11 is a view showing a configuration of a DRAM cell according to a sixth embodiment of the present invention. The present drawing is a cross-sectional view of a cut area of the DRAM cell, which is cut away and shown at a position including a region in which a transfer transistor and a capacitor are formed. Incidentally, the description of the same elements of structure as those employed in the aforementioned respective embodiments might be omitted.

A capacitor structure employed in the sixth embodiment is configured so that the surface of the storage node 32 of the capacitor structure described in the second embodiment is rough. Thus, projections and depressions or irregularities are formed on the surface of a portion of the storage node 32, which has been exposed from an interlayer insulator 26 and a stopper nitride film 28. A capacitor nitride film 42 is formed on the surface provided with the irregularities in this way. Thus, the area of the capacitor of the capacitor structure employed in the sixth embodiment becomes great by the irregularities as compared with the capacitor structure employed in the second embodiment. Therefore, the electric capacity Cs of the capacitor in the capacitor structure employed in the sixth embodiment is large by an increase in the capacitor area.

A method of forming the capacitor structure employed in the sixth embodiment will next be described with reference to FIGS. 32 and 33. FIGS. 32 and 33 are respectively cross-sectional views showing processes for forming the capacitor structure employed in the sixth embodiment. Incidentally, the sixth embodiment is identical in other process steps to the fifth embodiment except that the process step for patterning the second polysilicon layer 56, which has been described in the fifth embodiment, is different from that to be executed in the sixth embodiment. The sixth embodiment simply differs from the fifth embodiment in how to perform patterning in this process step.

Figure 32A:
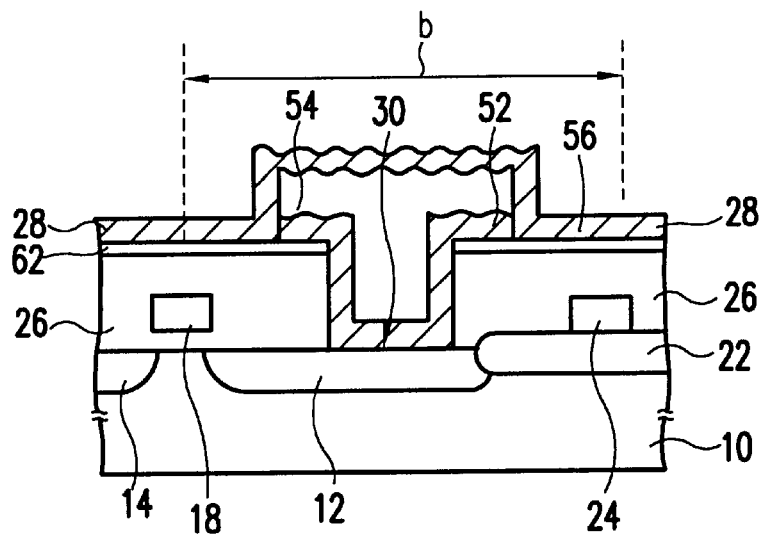
FIG. 32 is a view depicting a manufacturing process employed in the sixth embodiment of the present invention.
Figure 32B:
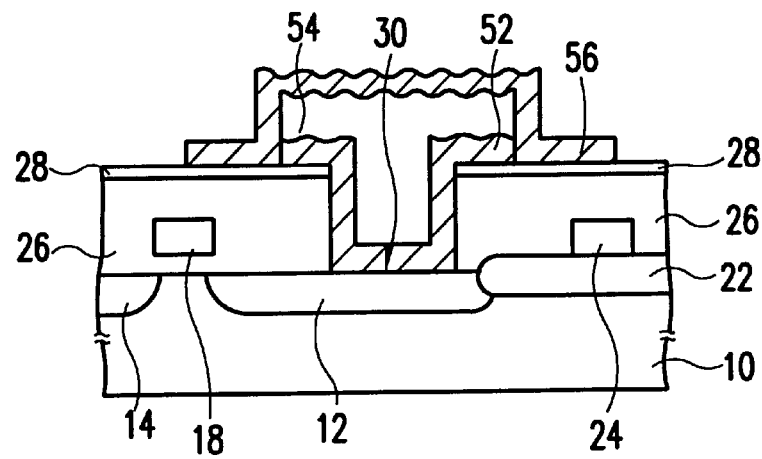

The process step for forming the second polysilicon layer 56 employed in the sixth embodiment into a predetermined pattern corresponds to a process step for patterning a second polysilicon layer 56 adjoining side portions of a first polysilicon layer 52 and a first PSG film 54 on the side near a bit line contact hole 40, a second polysilicon layer 56 adjoining side portions of the first polysilicon layer 52 and the first PSG film 54 on the side far from the bit line contact hole 40, and a region (corresponding to a region designated at symbol b in FIG. 32(A) showing a process chart equivalent to FIG. 26(A)) of the second polysilicon layer 56, which linearly extends between the second polysilicon layers 56 adjoining these side portions, such that they remain with a drain contact hole 30 interposed between the second polysilicon layers 56. As shown in FIG. 32(B), the remaining portions cover the upper surface of the first PSG film 54 and the two side portions and side portions of the first PSG film 54, which are other than the above-described side portions, are not covered with the second polysilicon layer 56.

Figure 32C:
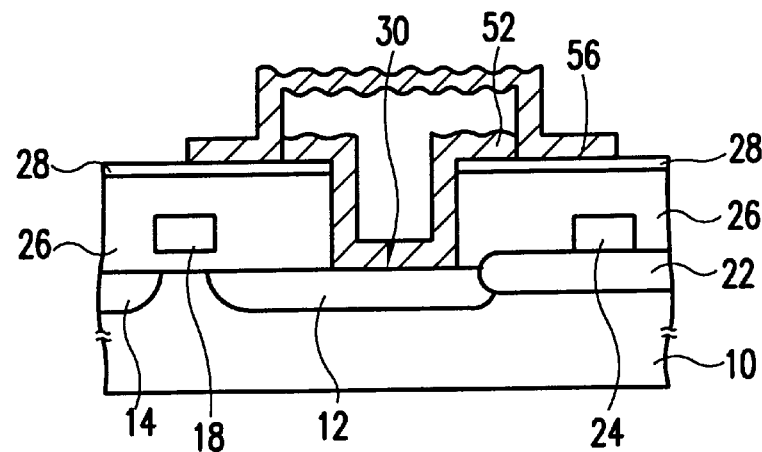
Figure 33A:
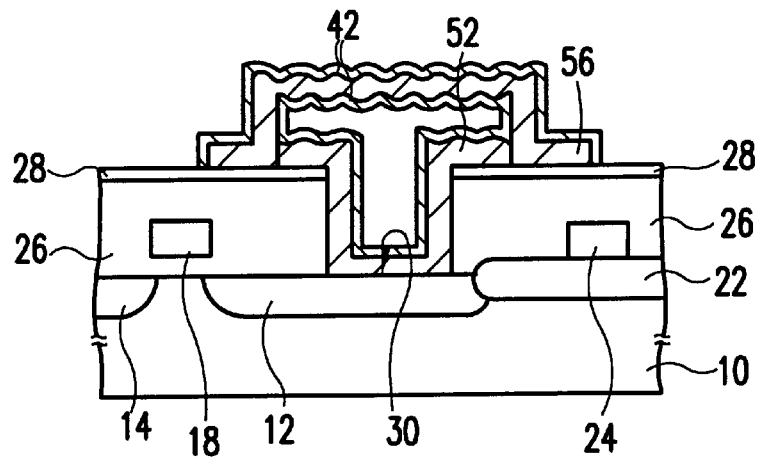
FIG. 33 is a view showing another manufacturing process employed in the sixth embodiment, which follows the manufacturing process shown in FIG. 32.
Figure 33B:
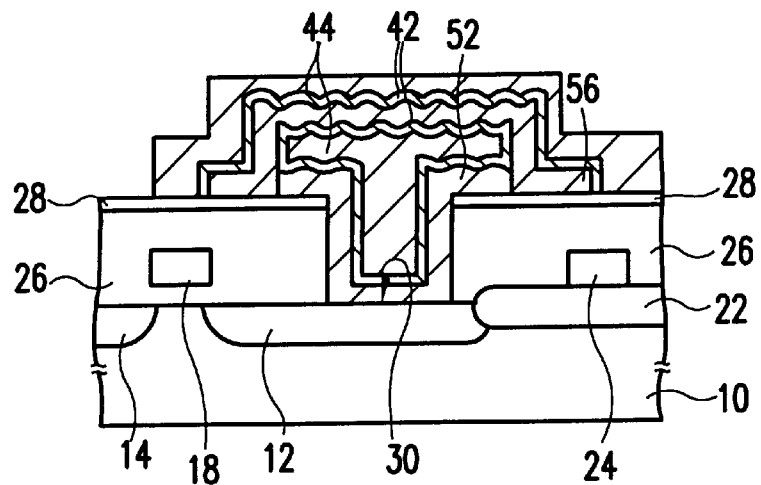

Next, the capacitor structure employed in the sixth embodiment can be formed by removing the first PSG film 54 (see FIG. 32(C)), forming a capacitor nitride film 42 (see FIG. 33(A)) and forming a cell plate 44 (see FIG. 33(B)) in a manner similar to the forming process steps employed in the aforementioned embodiment.

The capacitor structure employed in the sixth embodiment can be fabricated even by another forming method to be described next.

Another method of forming the capacitor structure employed in the sixth embodiment will be described with reference to FIGS. 34 and 35. FIGS. 34 and 35 are respectively cross-sectional views showing modifications of the manufacturing processes used for the capacitor structure employed in the sixth embodiment. The modifications are identical in others to those described in the fifth embodiment except that only how to pattern the second polysilicon layer 56 in the forming process steps employed in the fifth embodiment is different from that employed in the sixth embodiment.

Figure 34A:
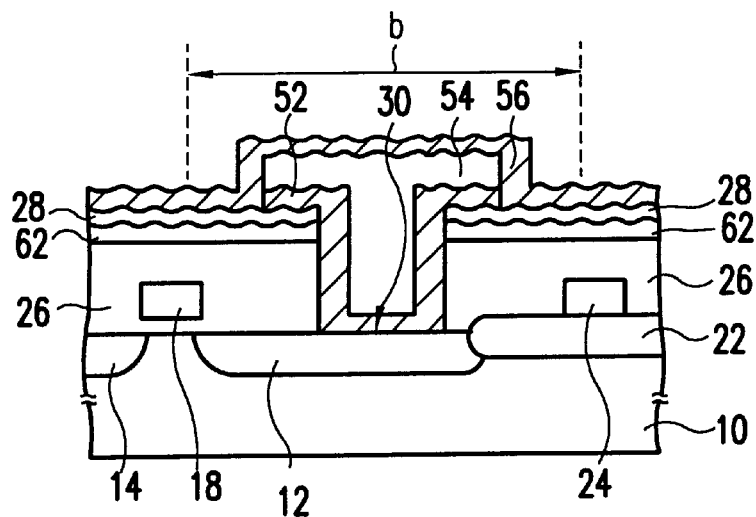
FIG. 34 is a view illustrating a modification of the manufacturing process employed in the sixth embodiment.
Figure 34B:
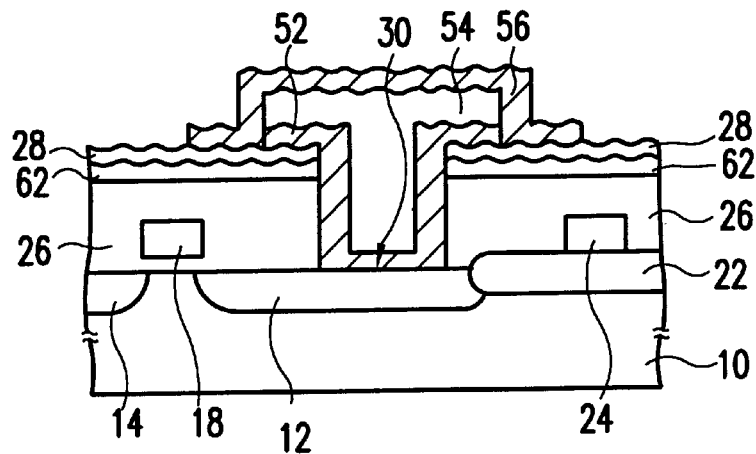

In the process step for shaping the second polysilicon layer 56 employed in the sixth embodiment into a predetermined pattern, a second polysilicon layer 56 adjoining side portions of a first polysilicon layer 52 and a first PSG film 54 on the side near a bit line contact hole 40, a second polysilicon layer 56 adjoining side portions of the first polysilicon layer 52 and the first PSG film 54 on the side far from the bit line contact hole 40, and a region (corresponding to a region designated at symbol b in FIG. 34(A) showing a process chart equivalent to FIG. 30(B)) of the second polysilicon layer 56, which linearly extends between the second polysilicon layers 56 adjoining these side portions, are patterned such that they remain with a drain contact hole 30 interposed between the second polysilicon layers 56. The remaining portions cover the upper surface of the first PSG film 54 and the two side portions, and side portions of the first PSG film 54, which are other than the above-described side portions, are not covered with the second polysilicon layer 56 (see FIG. 34(B)).

Figure 34C:
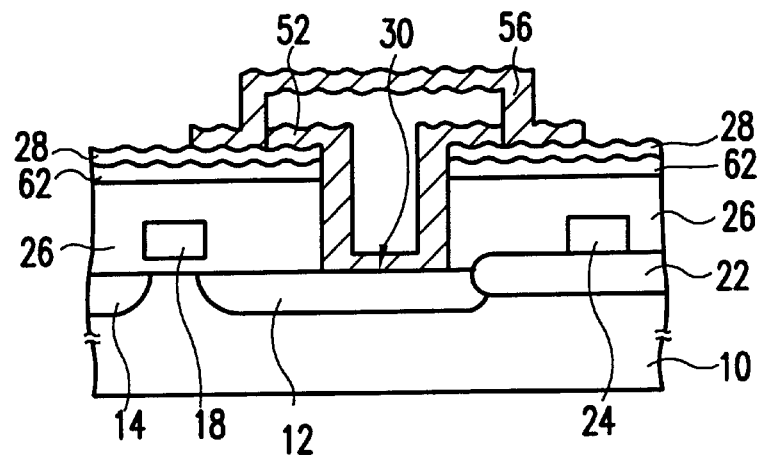
Figure 35A:
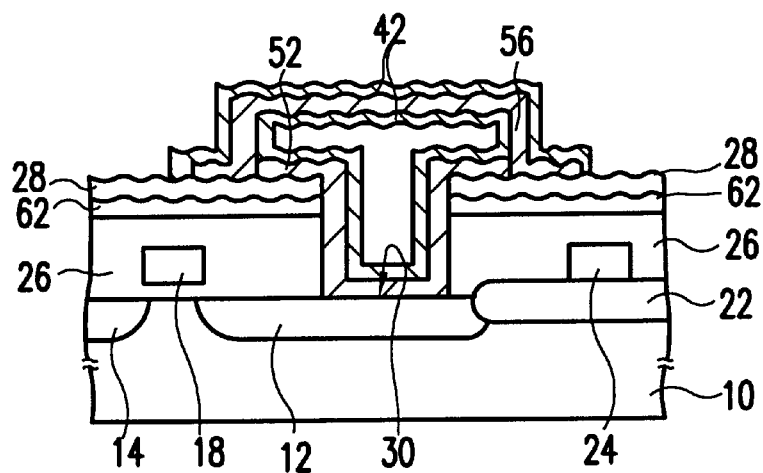
FIG. 35 is a view depicting another modification of the manufacturing process employed in the sixth embodiment, which follows the modification shown in FIG. 34.
Figure 35B:
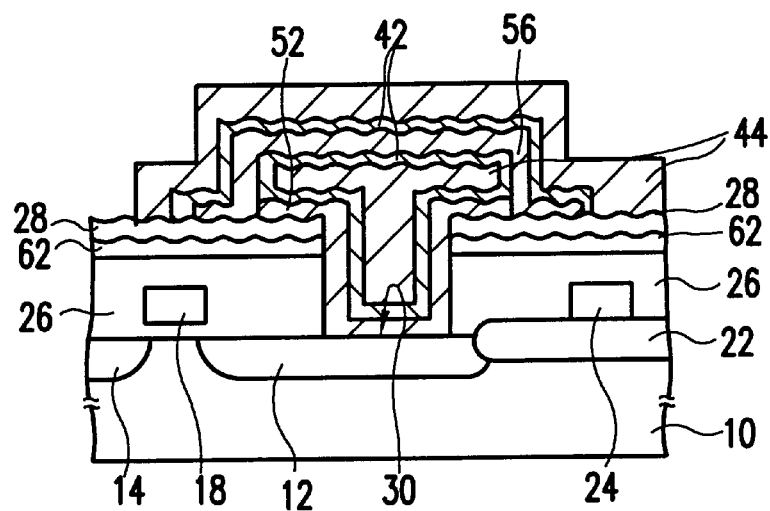

Thereafter, the capacitor structure employed in the sixth embodiment can be formed by removing the first PSG film 54 (see FIG. 34(C)), forming a capacitor nitride film 42 (see FIG. 35(A)) and forming a cell plate 44 (see FIG. 35(B)).

[Seventh Embodiment]

Figure 12:
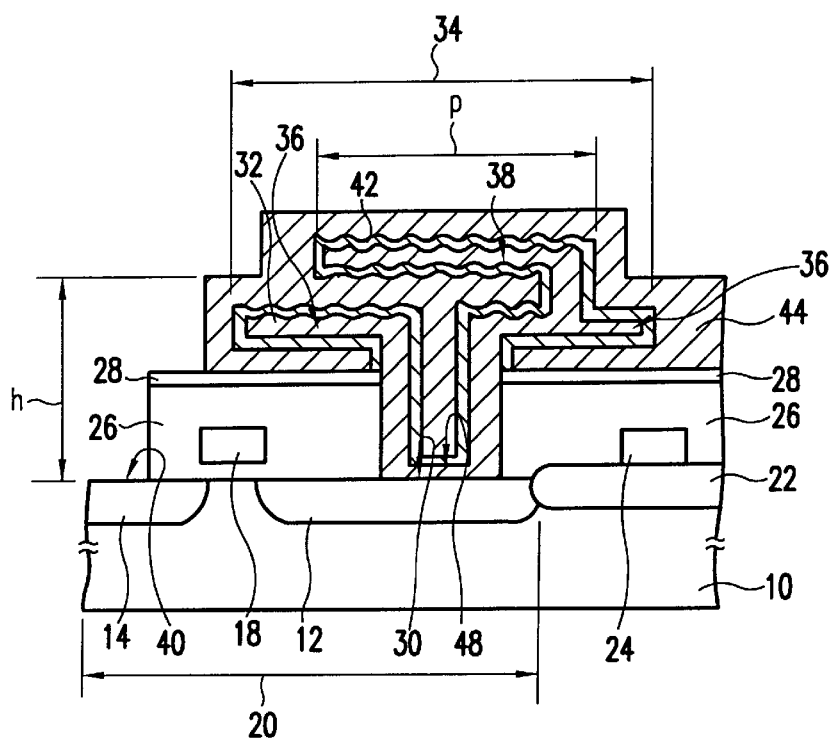
FIG. 12 is a view depicting a configuration of a DRAM cell according to a seventh embodiment of the present invention.

FIG. 12 is a view showing a configuration of a DRAM cell according to a seventh embodiment of the present invention. The present drawing is a cross-sectional view of a cut area of the DRAM cell, which is cut away and shown at a position including a region in which a transfer transistor and a capacitor are formed. Incidentally, the description of the same elements of structure as those employed in the aforementioned respective embodiments might be omitted.

A capacitor structure employed in the seventh embodiment is configured so that the surface of the storage node 32 of the capacitor structure described in the third embodiment is rough. Thus, projections and depressions or irregularities are formed on a portion of the storage node 32, which has been exposed from an interlayer insulator 26 and a stopper nitride film 28. A capacitor nitride film 42 is formed on the surface provided with the irregularities in this way. Thus, the area of the capacitor of the capacitor structure employed in the seventh embodiment becomes great by the irregularities as compared with the capacitor structure employed in the third embodiment. Therefore, the electric capacity Cs of the capacitor is large by an increase in the capacitor area.

A method of forming the capacitor structure employed in the seventh embodiment will next be described with reference to FIGS. 36 through 38. FIGS. 36 through 38 are respectively cross-sectional views showing processes for forming the capacitor structure employed in the seventh embodiment. Incidentally, process steps up to a process step for forming a first polysilicon layer, which will be described later, are identical to those employed in the third embodiment.

As shown in FIG. 19(A), the interlayer insulator 26, the stopper nitride film 28 and the second PSG film 58 are first successively stacked on the Si semiconductor substrate 10 with the drain region 12 and the source region 14 formed therein.

Next, the drain contact hole 30 is defined in the interlayer insulator 26, the stopper nitride film 28 and the second PSG film 58 above the drain region 12 as shown in FIG. 19(B).

The first polysilicon layer 52 is then formed over the upper surface of the second PSG film 58 and the drain region 12 exposed from the drain contact hole 30, as shown in FIG. 19(C).

Figure 36A:
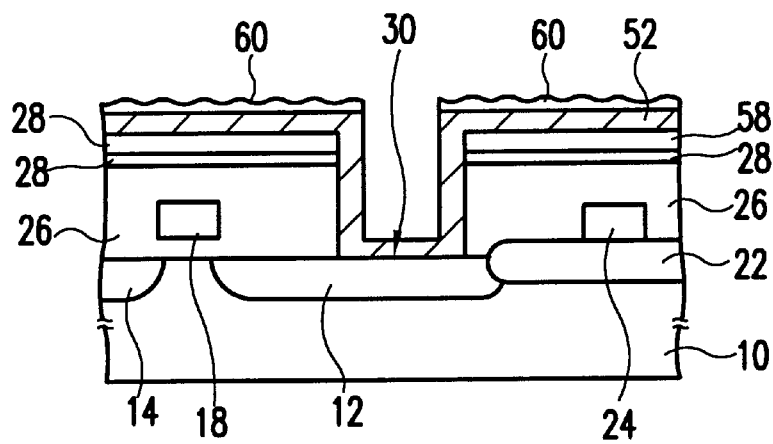
FIG. 36 is a view showing a manufacturing process employed in the seventh embodiment of the present invention.

Next, a rough-surface polysilicon layer 60 is formed on the upper surface of the first polysilicon layer 52 formed on the upper surface of the second PSG film 58 as shown in FIG. 36(A).

The rough-surface polysilicon layer 60 is a polysilicon layer whose surface has irregularities, as has been described in the fifth embodiment. As described above, the impurities have been introduced into the rough-surface polysilicon layer 60 to improve conductivity.

Figure 36B:
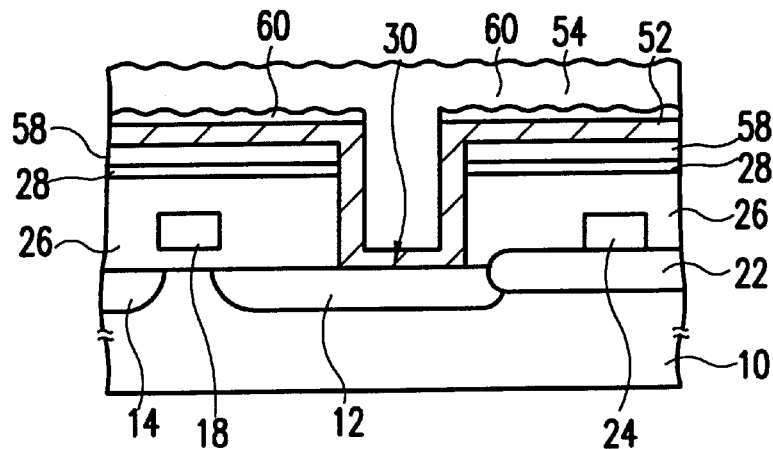

Next, a first PSG film 54 is formed on the upper surfaces of the rough-surface polysilicon layer 60 and the first polysilicon layer 52 as shown in FIG. 36(B).

The surface of the first PSG film 54 formed on the upper surface of the rough-surface polysilicon layer 60 takes a shape on which irregular configurations on the surface of the rough-surface polysilicon layer 60 have been reflected.

Figure 36C:
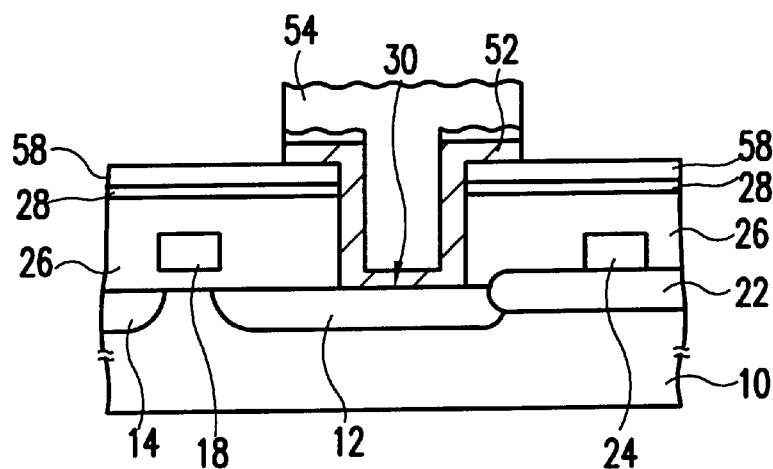

Next, the rough-surface polysilicon layer 60, the first PSG film 54 and the first polysilicon layer 52 are shaped into predetermined patterns as shown in FIG. 36(C).

Other portions are removed by this patterning so that the rough-surface polysilicon layer 60, the first PSG film 54 and the first polysilicon layer 52 on a region broader than the region in which the drain contact hole 30 is defined, are left. In the drawing, the rough-surface polysilicon layer 60 and the first polysilicon layer 52 are formed as an integral structure and both shown as the first polysilicon layer 52.

Figure 37A:
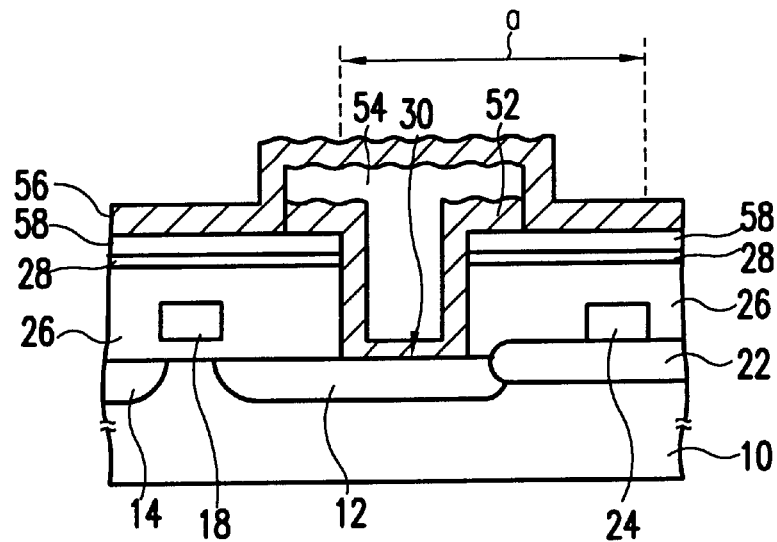
FIG. 37 is a view illustrating another manufacturing process employed in the seventh embodiment, which follows the manufacturing process shown in FIG. 36.

Next, the patterned rough-surface polysilicon layer 60, first PSG film 54 and first polysilicon layer 52 are covered with a second polysilicon layer 56 as shown in FIG. 37(A).

The surface of the second polysilicon layer 56 takes a shape on which irregularities on the surface of the first PSG film 54 have been reflected.

Figure 37B:
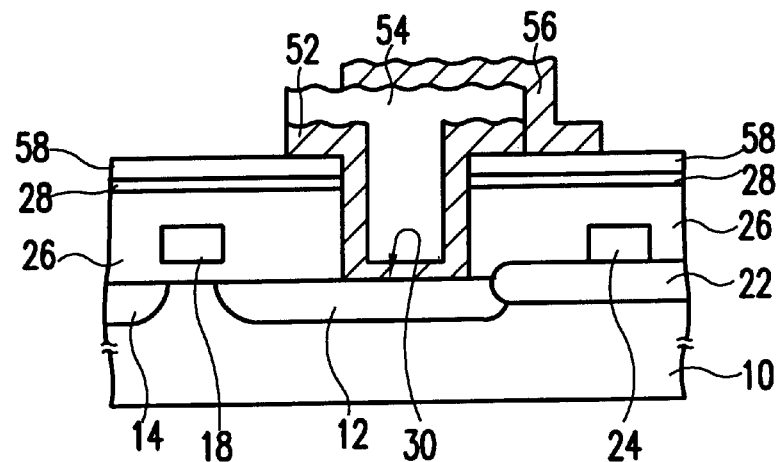

Next, the second polysilicon layer 56 is shaped into a predetermined pattern so as to expose the first PSG film 54 as shown in FIG. 37(B).

This patterning is performed so as to remove the second polysilicon layer 56 on the definition side of a bit line contact hole. This patterning allows only the second polysilicon layer 56 placed in a region corresponding to a range indicated by symbol a in FIG. 37(A) to remain and permits the removal of the second polysilicon layer 56 falling within another region.

Figure 37C:
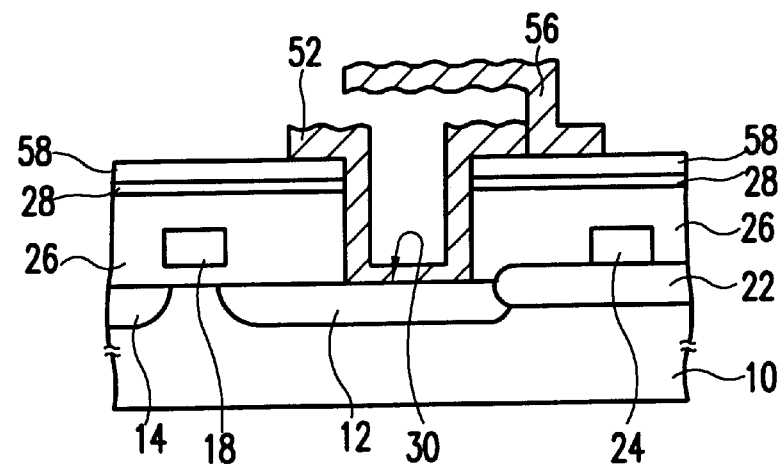

Next, the first PSG film 54 is removed as illustrated in FIG. 37(C).

Figure 38A:
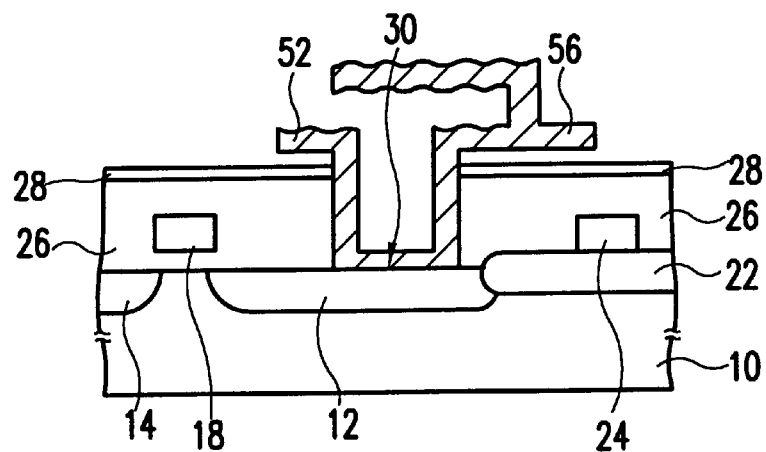
FIG. 38 is a view depicting a further manufacturing process employed in the seventh embodiment, which follows the manufacturing process shown in FIG. 37.

In this process step, all of the first PSG film 54 is removed. A second PSG film 58 is removed simultaneously with the removal of the first PSG film 54 as shown in FIG. 38(A).

As a result of the removal of the second PSG film 58, the lower surfaces of the first and second polysilicon layers 52 and 56 fall into a state of being spaced away from the stopper nitride film 28.

Figure 38B:
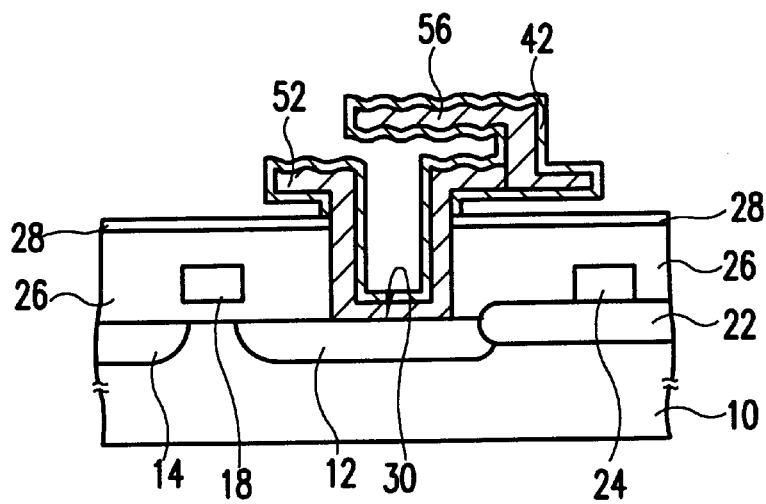

Next, a capacitor nitride film 42 is formed on the surfaces of the rough-surface polysilicon layer 60 and first and second polysilicon layers 52 and 56 as shown in FIG. 38(B).

The surface of the capacitor nitride film 42 takes a shape on which irregular configurations on the surfaces of the rough-surface polysilicon layer 60 and second polysilicon layer 56 have been reflected.

Figure 38C:
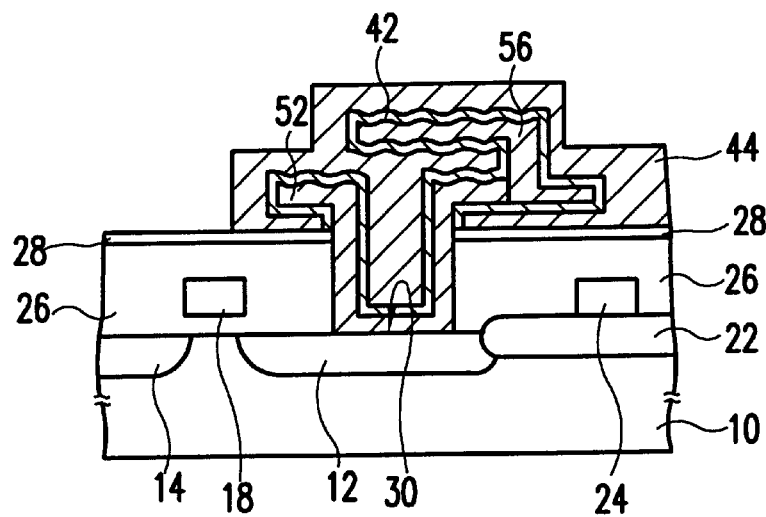

Next, a cell plate film is formed on the capacitor nitride film 42 as shown in FIG. 38(C). Thereafter, the cell plate film is subjected to patterning to form a cell plate 44.

According to the above-described forming process steps, the capacitor structure employed in the seventh embodiment can be formed. The capacitor structure employed in the seventh embodiment can be fabricated even by another forming method to be described next.

Another method of forming the capacitor structure employed in the seventh embodiment will be described with reference to FIGS. 39 through 42. FIGS. 39 through 42 are respectively cross-sectional views showing modifications of the forming processes used for the capacitor structure employed in the seventh embodiment.

Figure 39A:
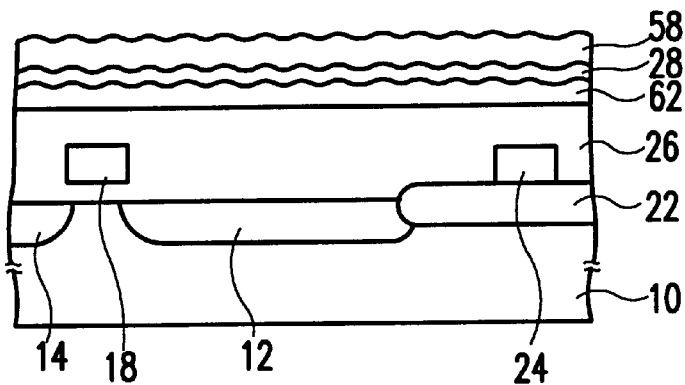
FIG. 39 is a view showing a modification of the manufacturing process employed in the seventh embodiment.

As shown in FIG. 39(A), an interlayer insulator 26, an SOG film 62, a stopper nitride film 28 and a second PSG film 58 are first successively stacked on an Si semiconductor substrate 10 with a drain region 12 and a source region 14 formed therein.

The SOG film 62 can be formed on the upper surface of the interlayer insulator 26 in a manner similar to the process steps (see FIGS. 28(A) and 28(B)) described in the fifth embodiment.

As shown in FIG. 28(A), the interlayer insulator 26 and the SOG film 62 are firstly successively stacked on the Si semiconductor substrate 10 with the drain region 12 and the source region 14 formed therein.

Next, the upper surface of the SOG film 62 is etched to fall into a rough surface as shown in FIG. 28(B).

The stopper nitride film 28 and the second PSG film 58 are then successively stacked on the etched SOG film 62 as shown in FIG. 39(A).

The formed SOG film 62 is a rough surface film whose surface is irregular or uneven. Thus, the surfaces of the stopper nitride film 28 and the second PSG film 58 successively formed on the SOG film 62 also take shapes on which the uneven shapes of the SOG film 62 have been reflected.

Figure 39B:
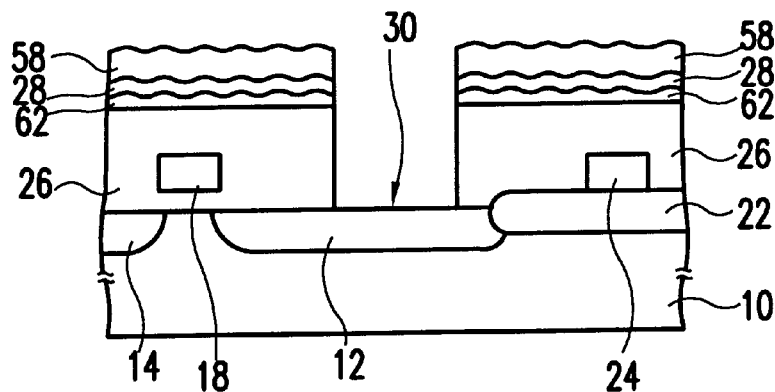

Next, a drain contact hole 30 is defined in the interlayer insulator 26, SOG film 62, stopper nitride film 28 and second PSG film 58 above the drain region 12 as shown in FIG. 39(B).

The drain contact hole 30 is provided at a position where the drain region 12 is exposed through its aperture.

Figure 39C:
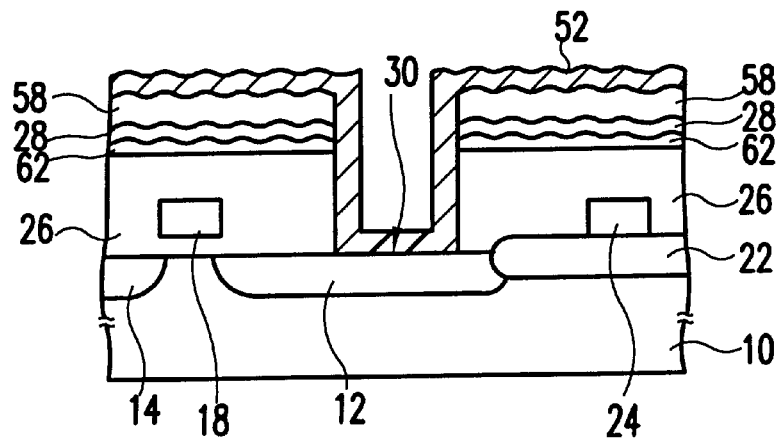

A first polysilicon layer 52 is formed over the second PSG film 58 and the drain region 12 exposed from the drain contact hole 30, as shown in FIG. 39(C).

The surface of the first polysilicon layer 52, which has been placed in a region formed on the upper surface of the second PSG film 58, takes a shape on which an irregular or uneven shape on the surface of the second PSG film 58 has been reflected.

Figure 40A:
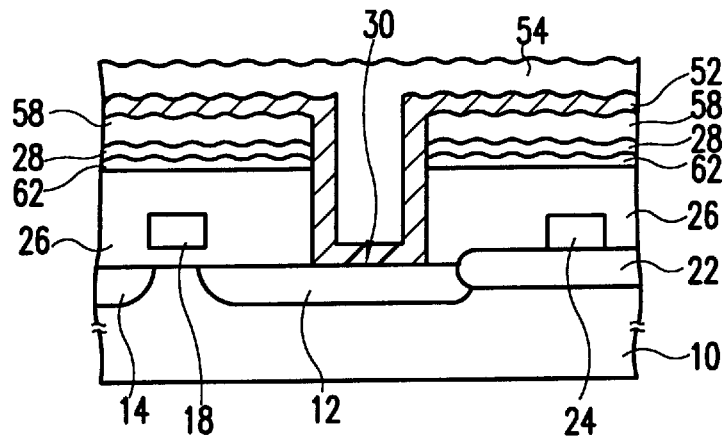
FIG. 40 is a view illustrating another modification of the manufacturing process employed in the seventh embodiment, which follows the modification shown in FIG. 39.

Next, a first PSG film 54 is formed on the upper surface of the first polysilicon layer 52 as shown in FIG. 40(A).

The surface of the first PSG film 54 takes a shape on which an uneven shape on the surface of the first polysilicon layer 52 has been reflected.

Figure 40B:
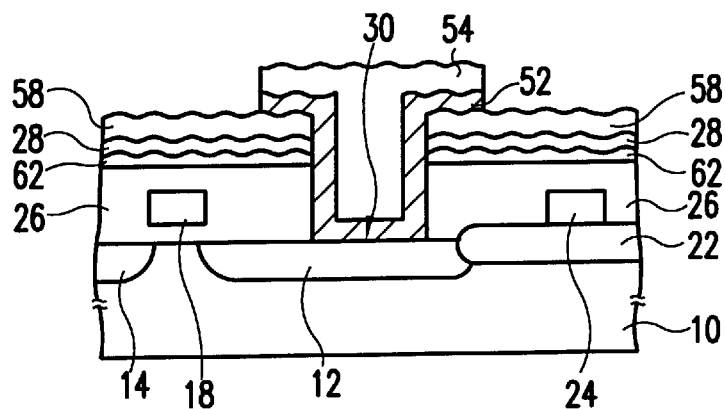

Each of the first PSG film 54 and the first polysilicon layer 52 is then shaped into a predetermined pattern as shown in FIG. 40(B).

This patterning is performed so as to leave the first PSG film 54 and the first polysilicon layer 52 on a region broader than the region in which the drain contact hole 30 is defined, and to remove other portions.

Figure 40C:
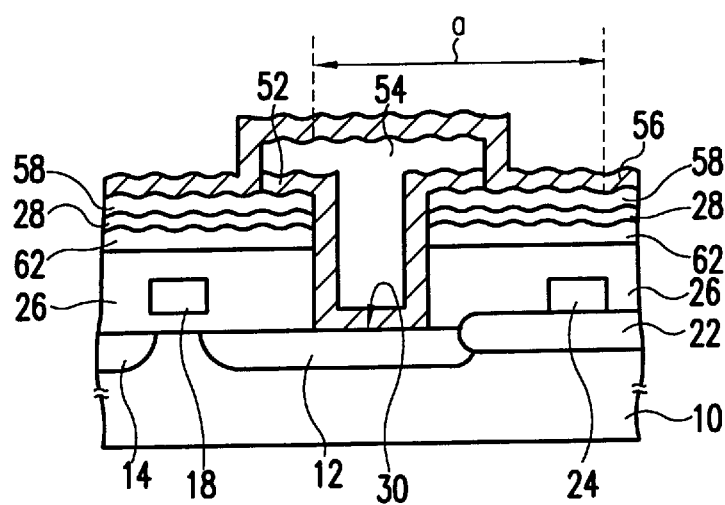

Next, the first PSG film 54 and first polysilicon layer 52 each shaped into the predetermined pattern are covered with a second polysilicon layer 56 as shown in FIG. 40(C).

The surface of the second polysilicon layer 56 takes a shape on which the uneven shapes on the surfaces of the first and second PSG films 54 and 58 have been reflected.

Figure 41A:
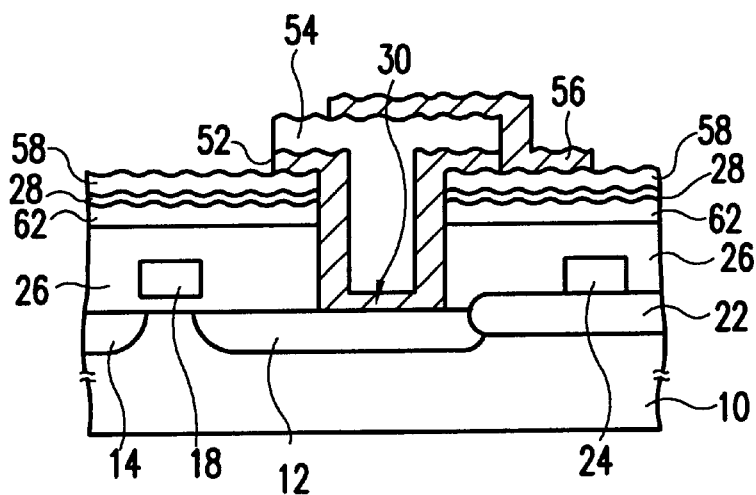
FIG. 41 is a view depicting a further modification of the manufacturing process employed in the seventh embodiment, which follows the modification shown in FIG. 40.

The second polysilicon layer 56 is then shaped into a predetermined pattern so as to expose the first PSG film 54 as shown in FIG. 41(A).

This patterning is carried out so as to remove the second polysilicon layer 56 on the definition side of a bit line contact hole. Thus, the second polysilicon layer 56 placed in a region other the region designated at symbol a in FIG. 40(A) is removed except for the second polysilicon layer 56 placed in the region designated at symbol a in FIG. 40(A).

Figure 41B:
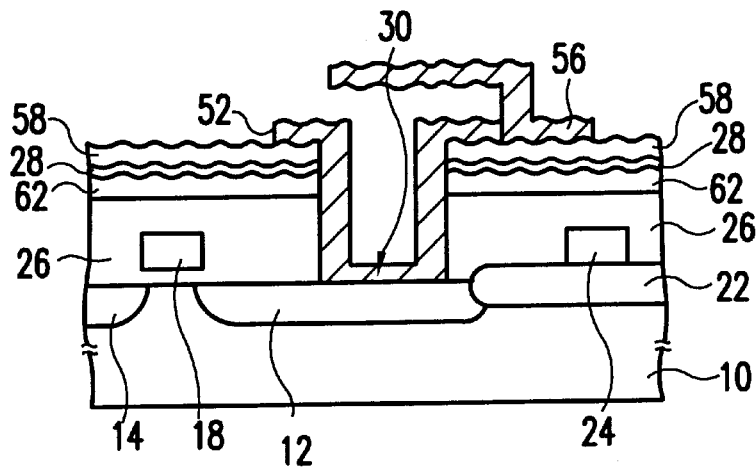

Next, the first PSG film 54 is removed as shown in FIG. 41(B).

Figure 41C:
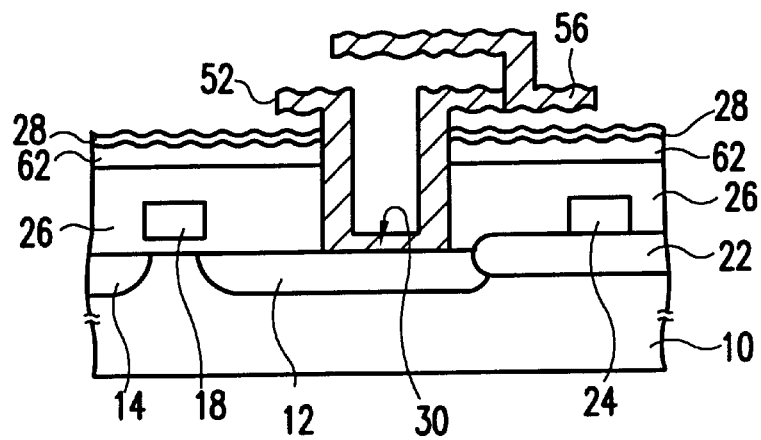

The second PSG film 58 is then removed as shown in FIG. 41(C).

The second PSG film 58 may be removed simultaneously with the first PSG film 54. As a result of the removal of the second PSG film 58, the lower surfaces of the first and second polysilicon layers 52 and 56 can be held in a state of being spaced away from the stopper nitride film 28.

Figure 42A:
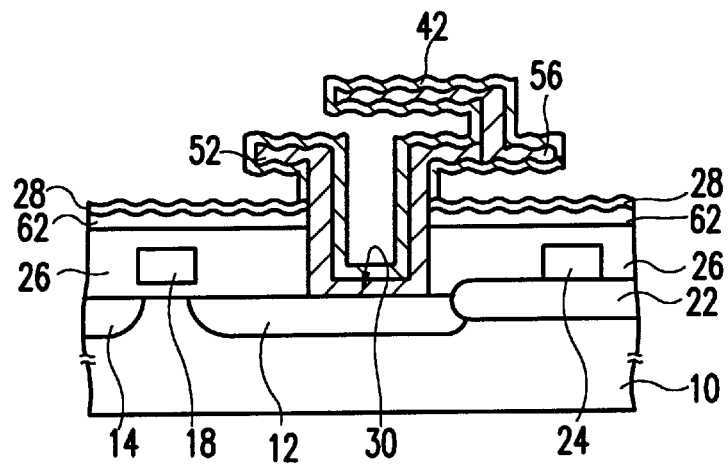
FIG. 42 is a view showing a still further modification of the manufacturing process employed in the seventh embodiment, which follows the modification shown in FIG. 41.

Next, a capacitor nitride film 42 is formed on the exposed surfaces of the first and second polysilicon layers 52 and 56 as shown in FIG. 42(A).

The surface of the capacitor nitride film 42 takes a shape on which irregular configurations on the surfaces of the first and second polysilicon layer 52 and 56 have been reflected.

Figure 42B:
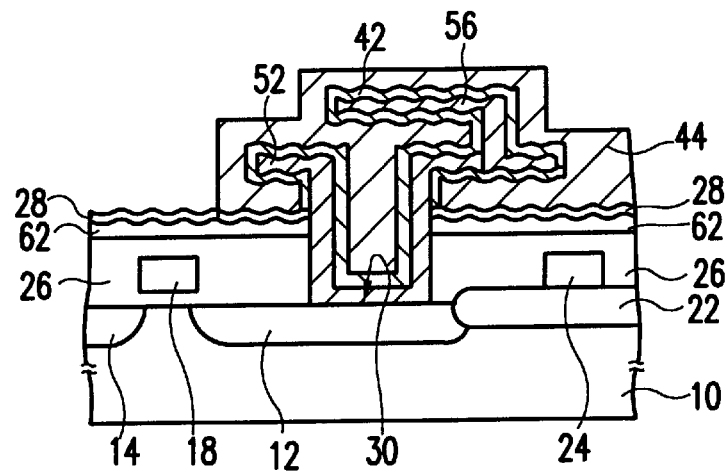

Next, a cell plate film is formed on the capacitor nitride film 42 as shown in FIG. 42(B). Thereafter, the cell plate film is shaped into a predetermined pattern to form a cell plate 44.

According to the above-described forming process steps, the capacitor structure employed in the seventh embodiment can be formed. The capacitor structure employed in the seventh embodiment, which has been formed in accordance with the forming process steps used for the modifications, takes the shape having the irregularities formed on the lower surface sides of the first and second polysilicon layers 52 and 56. Accordingly, the surface area of the storage node 32 constructed of the first and second polysilicon layers 52 and 56 further increases. Thus, the electric capacity Cs of the capacitor becomes greater.

[Eighth Embodiment]

Figure 13:
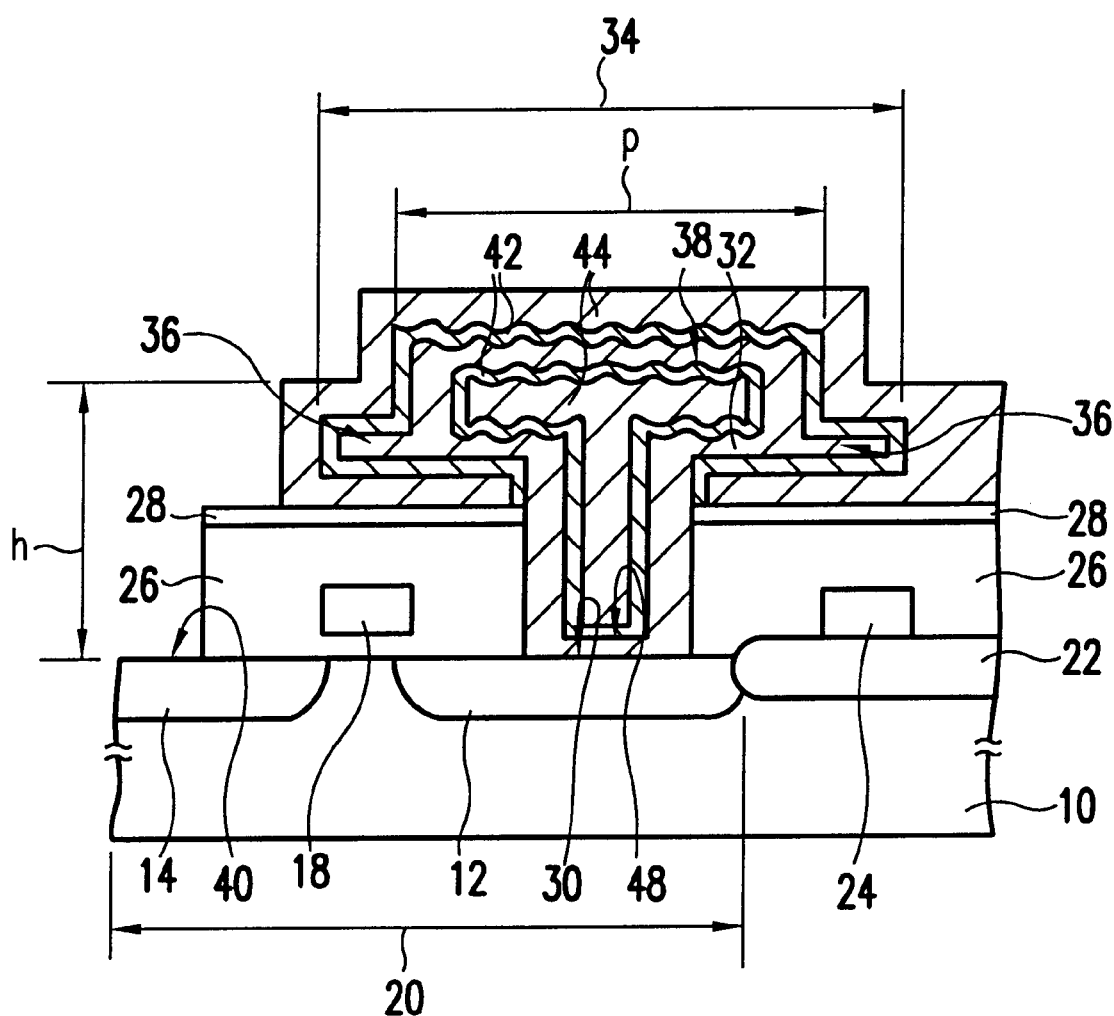
FIG. 13 is a view showing a configuration of a DRAM cell according to an eighth embodiment of the present invention.

FIG. 13 is a view showing a configuration of a DRAM cell according to an eighth embodiment of the present invention. The present drawing is a cross-sectional view of a cut area of the DRAM cell, which is cut away and shown at a position including a region in which a transfer transistor and a capacitor are formed. Incidentally, the description of the same elements of structure as those employed in the aforementioned respective embodiments might be omitted.

A capacitor structure employed in the eighth embodiment is configured so that the surface of the storage node 32 of the capacitor structure described in the fourth embodiment is rough. Namely, projections and depressions or irregularities are formed on a portion of the storage node 32, which has been exposed from an interlayer insulator 26 and a stopper nitride film 28. A capacitor nitride film 42 is formed on the surface provided with the irregularities in this way. Thus, the area of the capacitor of the capacitor structure employed in the eighth embodiment becomes great by the projections and depressions as compared with the capacitor structure employed in the fourth embodiment. Thus, the electric capacity Cs of the capacitor of the capacitor structure employed in the eighth embodiment is large by an increase in the capacitor area.

A method of forming the capacitor structure employed in the eighth embodiment will next be described with reference to FIGS. 43 and 44. FIGS. 43 and 44 are respectively cross-sectional views showing forming processes used for the capacitor structure employed in the eighth embodiment. The forming processes employed in the eighth embodiment are identical to those described in the seventh embodiment except that only the way of patterning the second polysilicon layer 56 in the forming process steps employed in the seventh embodiment differs from that in the forming processes employed in the eighth embodiment.

Figure 43A:
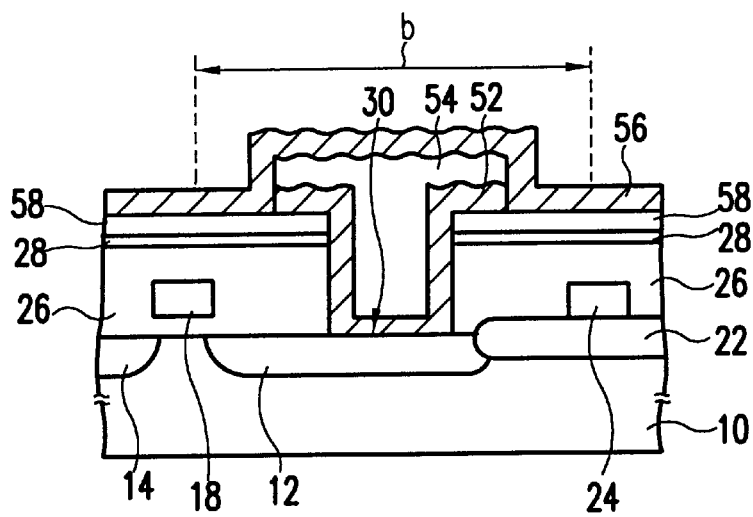
FIG. 43 is a view illustrating a manufacturing process employed in the eighth embodiment of the present invention.
Figure 43B:
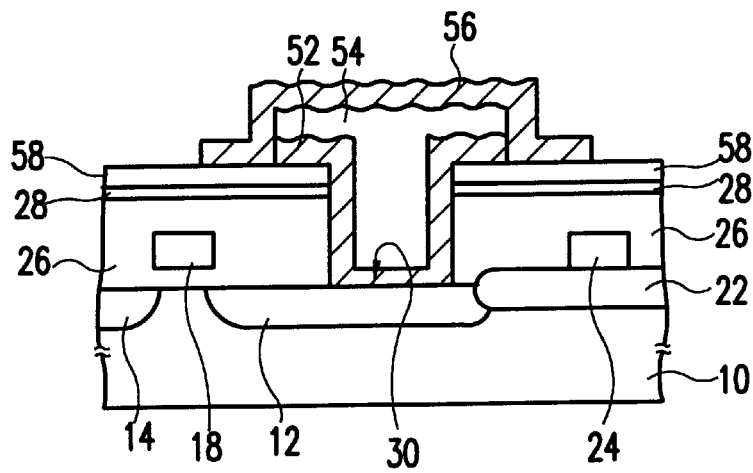

In the process step for shaping the second polysilicon layer 56 into a predetermined pattern, which is employed in the eighth embodiment, a second polysilicon layer 56 adjoining side portions of a first polysilicon layer 52 and a first PSG film 54 on the side near a bit line contact hole 40, a second polysilicon layer 56 adjoining side portions of the first polysilicon layer 52 and the first PSG film 54 on the side far from the bit line contact 40, and a region (corresponding to a region designated at symbol b in FIG. 43(A) showing a process chart equivalent to FIG. 37(A)) of the second polysilicon layer 56, which linearly extends between the second polysilicon layers 56 adjoining these side portions, are patterned such that they remain with a drain contact hole 30 interposed between the second polysilicon layers 56. The remaining portions cover the upper surface of the first PSG film 54 and the two side portions, and side portions of the first PSG film 54, which are other than the above-described side portions, are not covered with the second polysilicon layer 56 (see FIG. 43(B)).

Figure 43C:
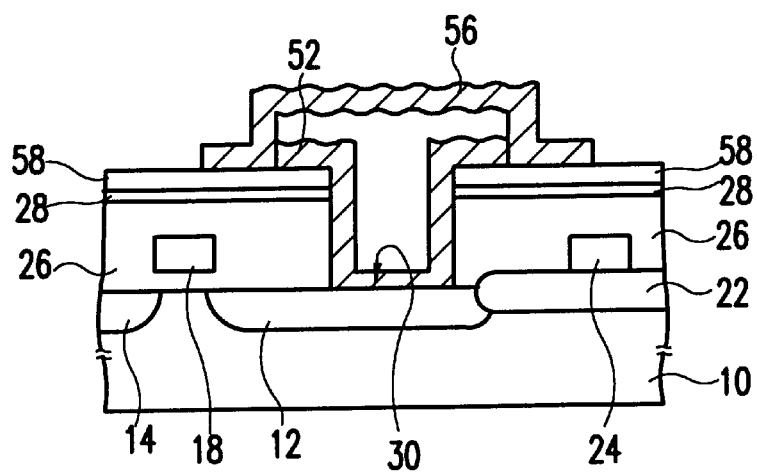
Figure 44A:
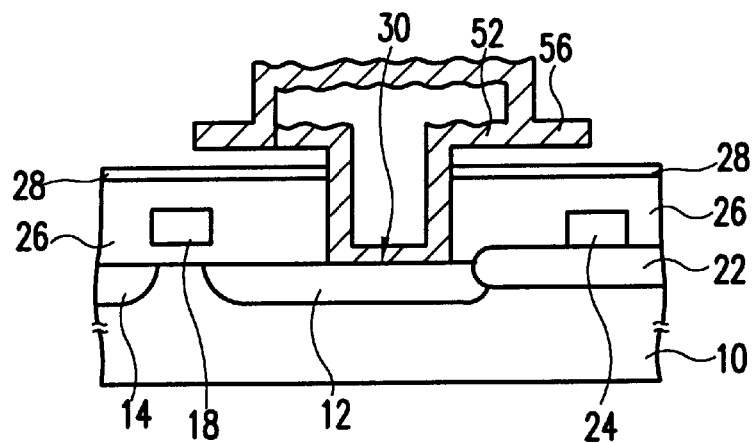
FIG. 44 is a view depicting another manufacturing process employed in the eighth embodiment, which follows the manufacturing process shown in FIG. 43.
Figure 44B:
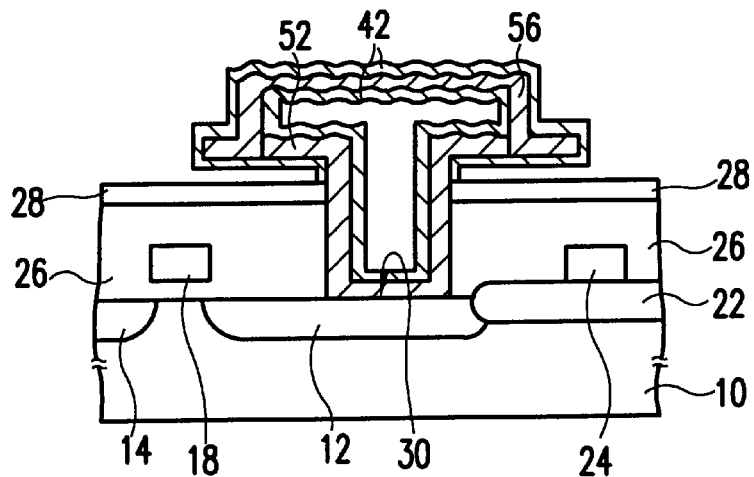
Figure 44C:
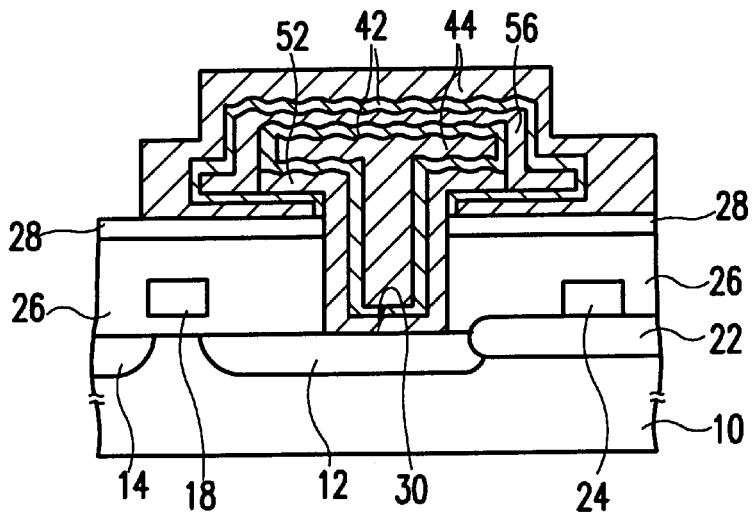

Thereafter, the capacitor structure employed in the eighth embodiment can be formed by removing the first PSG film 54 (see FIG. 43(C)), removing a second PSG film 58 (see FIG. 44(A)), forming a capacitor nitride film 42 (see FIG. 44(B)) and forming a cell plate 44 (see FIG. 44(C)).

The capacitor structure employed in the eighth embodiment can be fabricated even by another forming method to be described next.

Another method of forming the capacitor structure employed in the eighth embodiment will be described with reference to FIGS. 45 and 46. FIGS. 45 and 46 are respectively cross-sectional views showing modifications of the forming processes used for the capacitor structure employed in the eighth embodiment. The modifications are identical to those described in the seventh embodiment except that only how to pattern the second polysilicon layer in the forming process steps employed in the seventh embodiment is different from that in the forming process steps employed in the eighth embodiment.

Figure 45A:
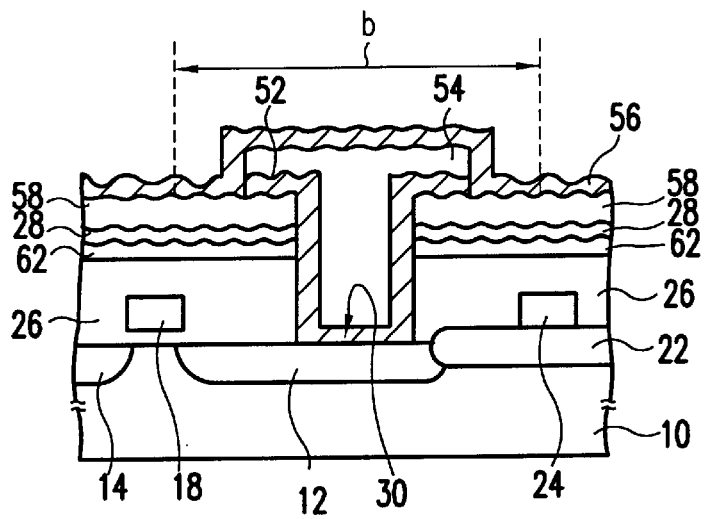
FIG. 45 is a view showing a modification of the manufacturing process employed in the eighth embodiment.
Figure 45B:
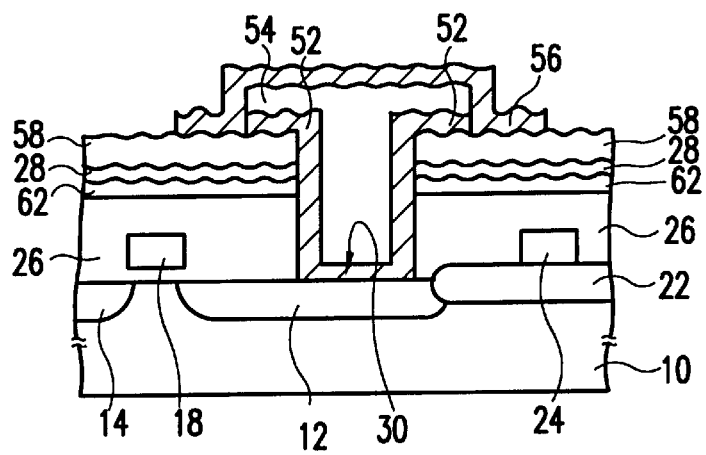

In the process step for forming the second polysilicon layer 56 employed in the eighth embodiment into a predetermined pattern, a second polysilicon layer 56 adjoining side portions of a first polysilicon layer 52 and a first PSG film 54 on the side near a bit line contact hole 40, a second polysilicon layer 56 adjoining side portions of the first polysilicon layer 52 and the first PSG film 54 on the side far from the bit line contact hole 40, and a region (corresponding to a region designated at symbol b in FIG. 45(A) showing a process chart equivalent to FIG. 40(C)) of the second polysilicon layer 56, which linearly extends between the second polysilicon layers 56 adjoining these side portions, are patterned such that they remain with a drain contact hole 30 interposed between the second polysilicon layers 56 (see FIG. 45(B)). The remaining portions cover the upper surface of the first PSG film 54 and the two side portions, and side portions of the first PSG film 54, which are other than the above-described side portions, are not covered with the second polysilicon layer 56 (see FIG. 45(B)).

Figure 45C:
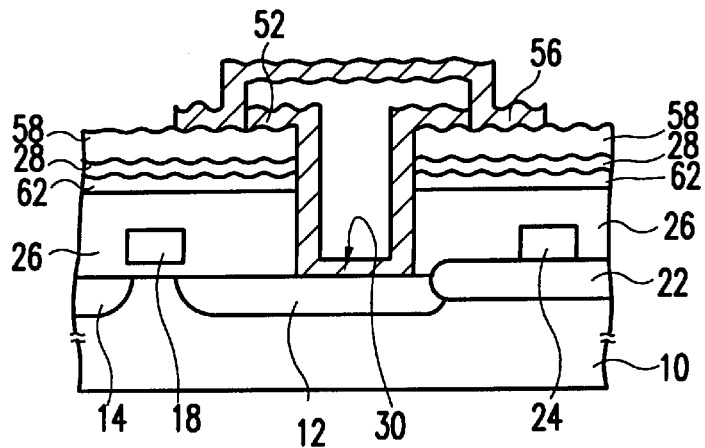
Figure 46A:
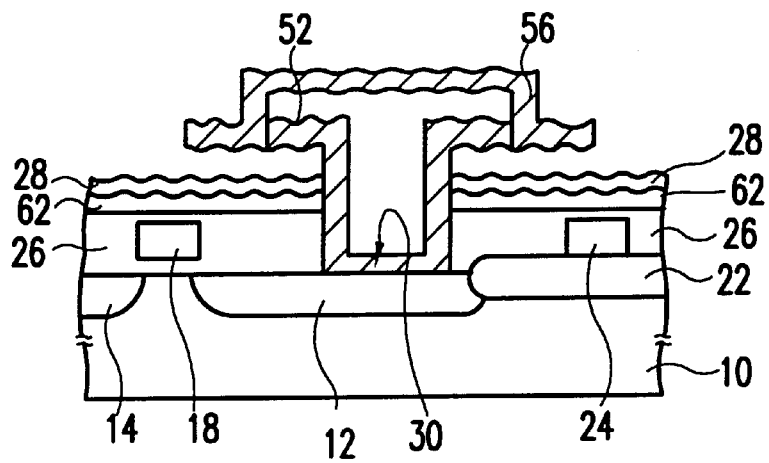
FIG. 46 is a view illustrating another modification of the manufacturing process employed in the eighth embodiment, which follows the modification shown in FIG. 45.
Figure 46B:
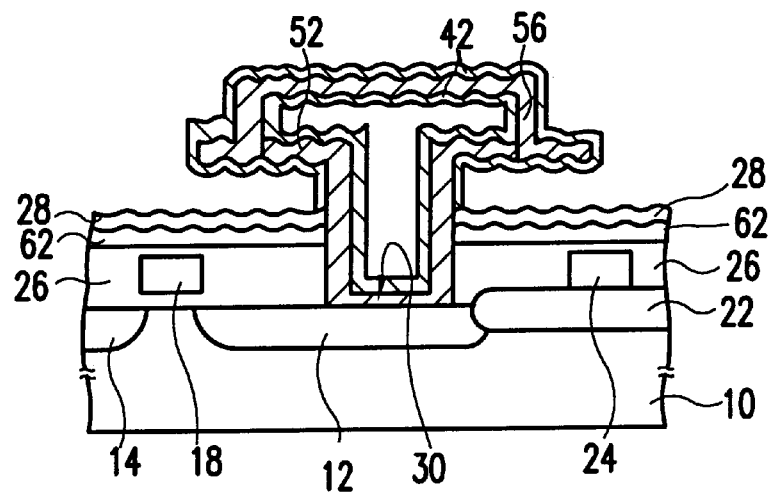
Figure 46C:
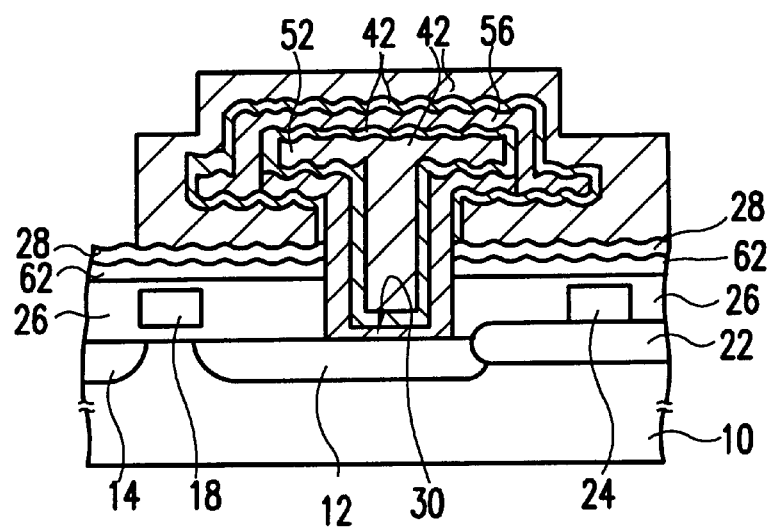

Thereafter, the capacitor structure employed in the eighth embodiment can be formed by removing the first PSG film 54 (see FIG. 45(C)), removing a second PSG film 58 (see FIG. 46(A)), forming a capacitor nitride film 42 (see FIG. 46(B)) and forming a cell plate 44 (see FIG. 46(C)).

The capacitor structure employed in the eighth embodiment, which has been formed in accordance with the forming process steps used for the modifications, takes a shape having irregularities formed even on the lower surface sides of the first and second polysilicon layers 52 and 56. Accordingly, the surface area of the storage node 32 constructed of the first and second polysilicon layers 52 and 56 further increases. As a result, the electric capacity Cs of the capacitor becomes greater.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor memory device comprising:
   a transistor having a first conductive layer, a second conductive layer and a gate electrode;
   a first insulating film formed on said transistor;
   a first opening defined in said first insulating film on said first conductive layer;
   a capacitor comprising,
      a first electrode having an on-film extending electrode portion connected to the first conductive layer through said first opening and extending over the first insulating film, and an electrode portion extending in a hood shape which projects in a first direction corresponding to the direction of the normal to a main surface of the first insulating film from said on-film extending electrode portion and extends in a second direction normal to the first direction,
      a second insulating film formed on an exposed surface of the first electrode, and
      a second electrode formed on an exposed surface of the second insulating film;
   a second opening defined in said first insulating film on said second conductive layer; and
   a bit line connected to said second conductive layer through said second opening, wherein said hood-shaped extending electrode portion has a structure having a distance of a projected drawing as viewed from above, which extends in the second direction, which is shorter than a distance of a projected drawing as viewed from above said capacitor, which extends in the second direction, and which protrudes only from said on-film extending electrode portion placed on the side opposite to said on-film extending electrode portion on the provision side of said second opening with respect to the first opening, a thickness from the second conductive layer to a top of the bit line is at least a thickness of the hood-shaped extending electrode portion lower than a thickness of the capacitor from the first conductive layer to a top of the capacitor.

2. A semiconductor memory device according to claim 1, wherein said hood-shaped extending electrode portion is provided in which the area of the projected drawing as viewed from above is smaller than the area of the projected drawing as viewed from above said capacitor.

3. A semiconductor memory device according to claim 1, wherein said hood-shaped extending electrode portion is provided in which the projected drawing as viewed from above is included in the projected drawing as viewed from above said capacitor.

4. A semiconductor memory device according to claim 1, wherein said hood-shaped extending electrode portion is provided which protrudes from said on-film extending electrode portions on both sides of said first opening.

5. A semiconductor memory device according to claim 1, wherein said on-film extending electrode portion is provided which is spaced away from an upper surface of the first insulating film.

6. A semiconductor memory device of claim 1, wherein at least one of said first and second electrodes are provided in which a surface thereof adjoining the second insulating film and parallel to a main surface of said semiconductor memory device includes repeating convex and concave shapes.

7. A semiconductor memory device of claim 1, wherein at least one of said on-film extending portion and hood-shaped extending electrode portion are provided in which a surface thereof adjoining the second insulating film includes repeating convex and concave shapes.

8. A stack-type capacitor structure suitable for use in a semiconductor memory device wherein a storage node constituting a capacitor is connected to a first conductive layer through a first opening defined in an insulating film and a bit line connected to a second conductive layer through a second opening defined in the insulating film, said storage node comprising a structure having an on-film extending portion extending to a capacitor region placed on the upper side of said insulating film and a fin-shaped electrode portion projecting from said on-film extending portion, the fin-shaped electrode projecting in a first direction corresponding to the direction of the normal to a main surface of the insulating film from said on-film extending electrode portion and extends in a second direction normal to the first direction,
   said fin-shaped electrode portion being provided within said capacitor region so as to occupy a region smaller than said capacitor region, said fin-shaped electrode portion extending over the first opening and, as viewed from above, an edge portion of the on-film extending electrode portion in the second direction being closer to the second opening than an edge portion of said fin-shaped extending electrode in the second direction, said fin-shape electrode protruding only from said on-film extending electrode portion placed on the side opposite to said on-film extending electrode portion on the provision side of said second opening with respect to the first opening, a thickness from the second conductive layer to a top of the bit line is at least a thickness of the fin-shaped electrode portion lower than a thickness of the capacitor from the first conductive layer to a top of the capacitor.

9. A stack-type capacitor structure suitable for use in a semiconductor memory device, according to claim 8, said semiconductor memory device being constructed such that a bit line is connected to a second conductive layer through a second opening defined in the insulating film, wherein said fin-shaped electrode portion is provided so as to be spaced away from said on-film extending portion on said second opening side.

10. A stack-type capacitor structure according to claim 9, wherein said fin-shaped electrode portion is shaped in the form of a roof which protrudes from said on-film extending portion provided on the side opposite to said second opening and extends to said second opening away from said on-film extending portion.

11. A stack-type capacitor structure suitable for use in a semiconductor memory device, according to claim 8, said semiconductor memory device being constructed such that a bit line is connected to a second conductive layer through a second opening defined in the insulating film, wherein said fin-shaped electrode portion is shaped in the form of a hood which protrudes from said on-film extending portion on the side opposite to said second opening and is connected to said on-film extending portion on the second opening side.

12. A stack-type capacitor structure according to any of claim 8, wherein a lower surface of said on-film extending portion is spaced away from an upper surface of said insulating film.

13. A stack-type capacitor structure according to any of claim 8, wherein said on-film extending portion and said fin-shaped electrode portion have surfaces shaped into irregularities respectively.

14. A semiconductor memory device comprising:
   a transistor having a first conductive layer, a second conductive layer and a gate electrode;
   a first insulating film formed on said transistor,
   a first opening defined in said first insulating film on said first conductive layer;
   a capacitor comprising,
      a first electrode having an on-film extending electrode portion connected to the first conductive layer through said first opening and extending over the first insulating film, and an electrode portion extending in a hood shape which projects in a first direction corresponding to the direction of the normal to a main surface of the first insulating film from said on-film extending electrode portion and extends in a second direction normal to the first direction,
      a second insulating film formed on an exposed surface of the first electrode, and
      a second electrode formed on an exposed surface of the second insulating film;
   a second opening defined in said first insulating film on said second conductive layer; and
   a bit line connected to said second conductive layer through said second opening,
   said semiconductor memory device having said hood-shaped extending electrode portion wherein, as viewed from above, an edge portion of the on-film extending electrode portion in the second direction is closer to the second opening than an edge portion of said hood-shaped extending electrode in the second direction and wherein said hood-shaped electrode portion extends over the first opening, said hood-shaped extending electrode protruding only from said on-film extending electrode portion placed on the side opposite to said on-film extending electrode portion on the provision side of said second opening with respect to the first opening, a thickness from the second conductive layer to a top of the bit line is at least a thickness of the hood-shaped extending electrode portion lower than a thickness of the capacitor from the first conductive layer to a top of the capacitor.

\* \* \* \* \*